United States Patent
More et al.

(10) Patent No.: US 12,550,413 B2
(45) Date of Patent: Feb. 10, 2026

(54) PLURALITY OF SEMICONDUCTOR FIN STRUCTURES IN P-TYPE METAL-OXIDE-SEMICONDUCTOR (MOS) REGION AND N-TYPE MOS REGION WITH A PLURALITY OF DIELECTRIC FEATURES IN BETWEEN AND METHODS OF FORMING THE SAME

(71) Applicant: TAIWAN SEMICONDUCTOR MANUFACTURING COMPANY, LTD., Hsinchu (TW)

(72) Inventors: Shahaji B. More, Hsinchu (TW); Cheng-Wei Chang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 446 days.

(21) Appl. No.: 18/097,247

(22) Filed: Jan. 15, 2023

(65) Prior Publication Data
US 2024/0243015 A1     Jul. 18, 2024

(51) Int. Cl.
*H10D 84/01*  (2025.01)
*H10D 84/03*  (2025.01)
*H10D 84/85*  (2025.01)

(52) U.S. Cl.
CPC ....... *H10D 84/017* (2025.01); *H10D 84/0186* (2025.01); *H10D 84/0193* (2025.01); *H10D 84/038* (2025.01); *H10D 84/853* (2025.01)

(58) Field of Classification Search
CPC ............. H10D 84/853; H10D 84/0193; H10D 84/017; H10D 84/0186; H10D 84/038; H10D 84/0188
See application file for complete search history.

(56) References Cited

U.S. PATENT DOCUMENTS 10,651,287 B2    5/2020  More et al.
2016/0087053 A1*  3/2016  Kim ..................... H10D 30/797
                                                257/369

(Continued)

FOREIGN PATENT DOCUMENTS

TW    202232759 A    8/2022
TW    202245260 A    11/2022

OTHER PUBLICATIONS

U.S. Appl. No. 17/825,307, filed May 26, 2022.

*Primary Examiner* — Changhyun Yi
(74) *Attorney, Agent, or Firm* — NZ Carr Law Office

(57) ABSTRACT

A semiconductor device structure, along with methods of forming such, are described. The method includes forming first and second semiconductor fins in an NMOS region and a PMOS region, respectively, forming a dielectric feature between the first and second semiconductor fins, recessing the first and second semiconductor fins, forming first and second source/drain epitaxial features over the recessed first and second semiconductor fins, respectively, depositing an interlayer dielectric layer over the first and second source/drain epitaxial features, and forming a first opening in the interlayer dielectric layer to expose a first portion of the first source/drain epitaxial feature and a second opening in the interlayer dielectric layer to expose a first portion of the second source/drain epitaxial feature. The first and second openings are separated by a distance that is about 1.5 times to about 2 times a width of the dielectric feature.

20 Claims, 26 Drawing Sheets

(56) References Cited

U.S. PATENT DOCUMENTS

| | | | |
|---|---|---|---|
| 2019/0164966 A1* | 5/2019 | Wang | H10D 62/151 |
| 2021/0217890 A1 | 7/2021 | Yang et al. | |
| 2021/0376150 A1* | 12/2021 | More | H10D 64/667 |
| 2022/0293599 A1 | 9/2022 | Chiu et al. | |
| 2023/0010146 A1 | 1/2023 | More | |
| 2023/0015781 A1* | 1/2023 | Someshwar | H10D 62/83 |

* cited by examiner

PLURALITY OF SEMICONDUCTOR FIN STRUCTURES IN P-TYPE METAL-OXIDE-SEMICONDUCTOR (MOS) REGION AND N-TYPE MOS REGION WITH A PLURALITY OF DIELECTRIC FEATURES IN BETWEEN AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
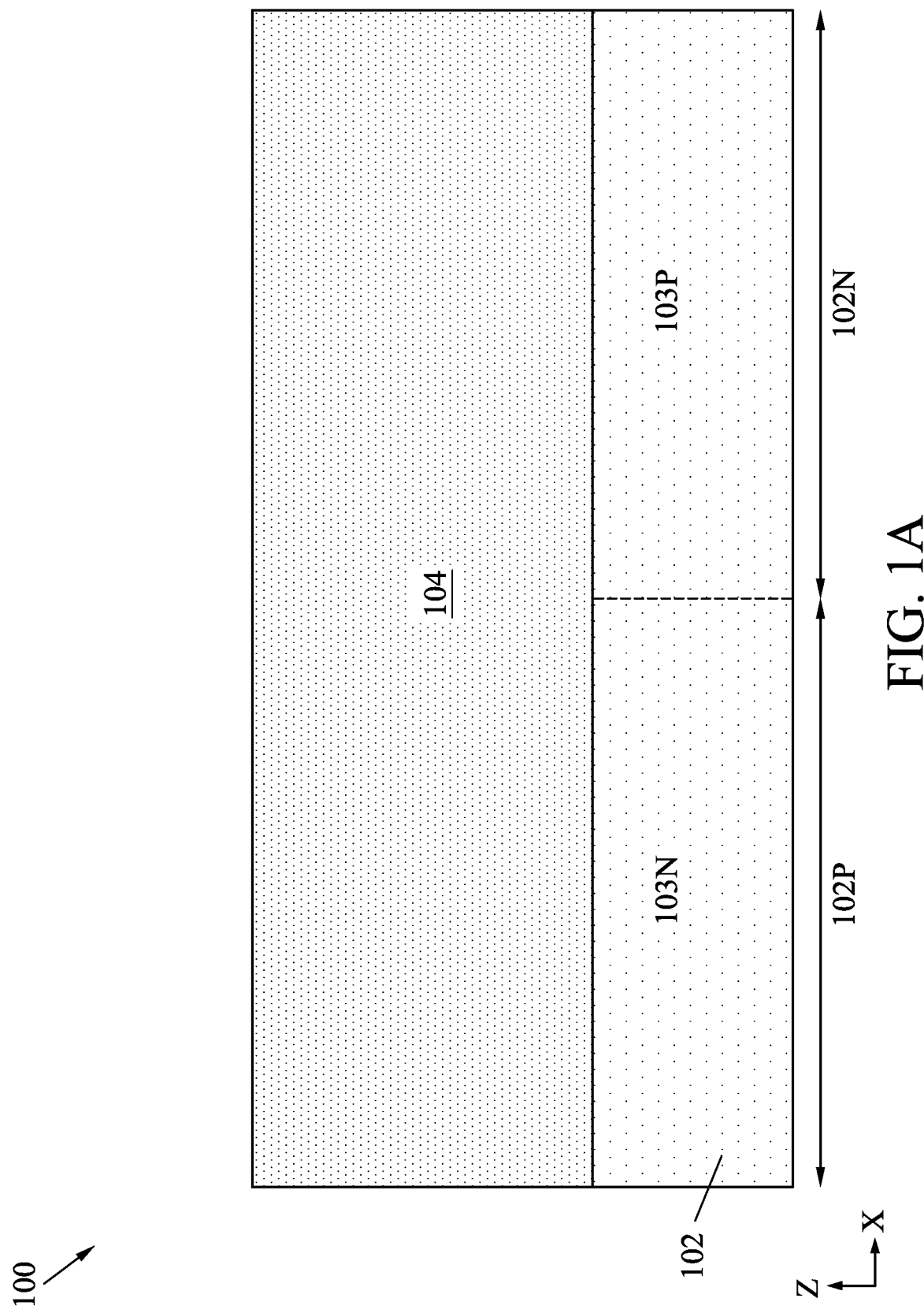
FIGS. 1A, 1B, 1C, 1D, 1E, and 1F are cross-sectional side views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-8B show exemplary sequential processes for manufacturing a semiconductor device structure 100, in accordance with some embodiments. It is understood that additional operations can be provided before, during, and after processes shown by FIGS. 1-8B and some of the operations described below can be replaced or eliminated, for additional embodiments of the method. The order of the operations/processes may be interchangeable.

FIGS. 1A-1F are cross-sectional side views of various stages of manufacturing a semiconductor device structure 100, in accordance with some embodiments. As shown in FIG. 1A, a first semiconductor layer 104 is formed on a substrate 102. In some embodiments, the substrate 102 is a bulk semiconductor substrate, such as a semiconductor wafer. For example, the substrate 102 is a silicon wafer. The substrate 102 may include silicon or another elementary semiconductor material such as germanium. In some other embodiments, the substrate 102 includes a compound semiconductor. The compound semiconductor may include gallium arsenide, silicon carbide, indium arsenide, indium phosphide, another suitable semiconductor material, or a combination thereof. In some embodiments, the substrate 102 is a semiconductor-on-insulator (SOI) substrate. The SOI substrate may be fabricated using a separation by implantation of oxygen (SIMOX) process, a wafer bonding process, another applicable method, or a combination thereof.

As shown in FIG. 1A, the substrate 102 has a P-type metal-oxide-semiconductor region 102P (PMOS region 102P) and an N-type metal-oxide-semiconductor region 102N (NMOS region 102N) adjacent to the PMOS region 102P, in accordance with some embodiments. In some embodiments of the present disclosure, the PMOS region 102P is used to form a PMOS structure thereon, whereas the NMOS region 102N is used to form an NMOS structure thereon. In some embodiments, an N-well region 103N and a P-well region 103P are formed in the substrate 102, as shown in FIG. 1A. In some embodiments, the N-well region 103N is formed in the substrate 102 in the PMOS region 102P, whereas the P-well region 103P is formed in the substrate 102 in the NMOS region 102N, as shown in FIG. 1A. In some embodiments, separate ion implantation processes are performed to form the P-well region 103P and the N-well region 103N. By using two different implantation mask layers (not shown), the P-well region 103P and the N-well region 103N are sequentially formed in different ion implantation processes.

The first semiconductor layer 104 is deposited over the substrate 102, as shown in FIG. 1A. The first semiconductor layer 104 may be made of any suitable semiconductor material, such as silicon, germanium, III-V semiconductor material, or combinations thereof. In some embodiments, the first semiconductor layer 104 is substantially made of silicon. The first semiconductor layer 104 may be formed by an epitaxial growth process, such as metal-organic chemical vapor deposition (MOCVD), metal-organic vapor phase epitaxy (MOVPE), plasma-enhanced chemical vapor deposition (PECVD), remote plasma chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable process.

Figure 1B:
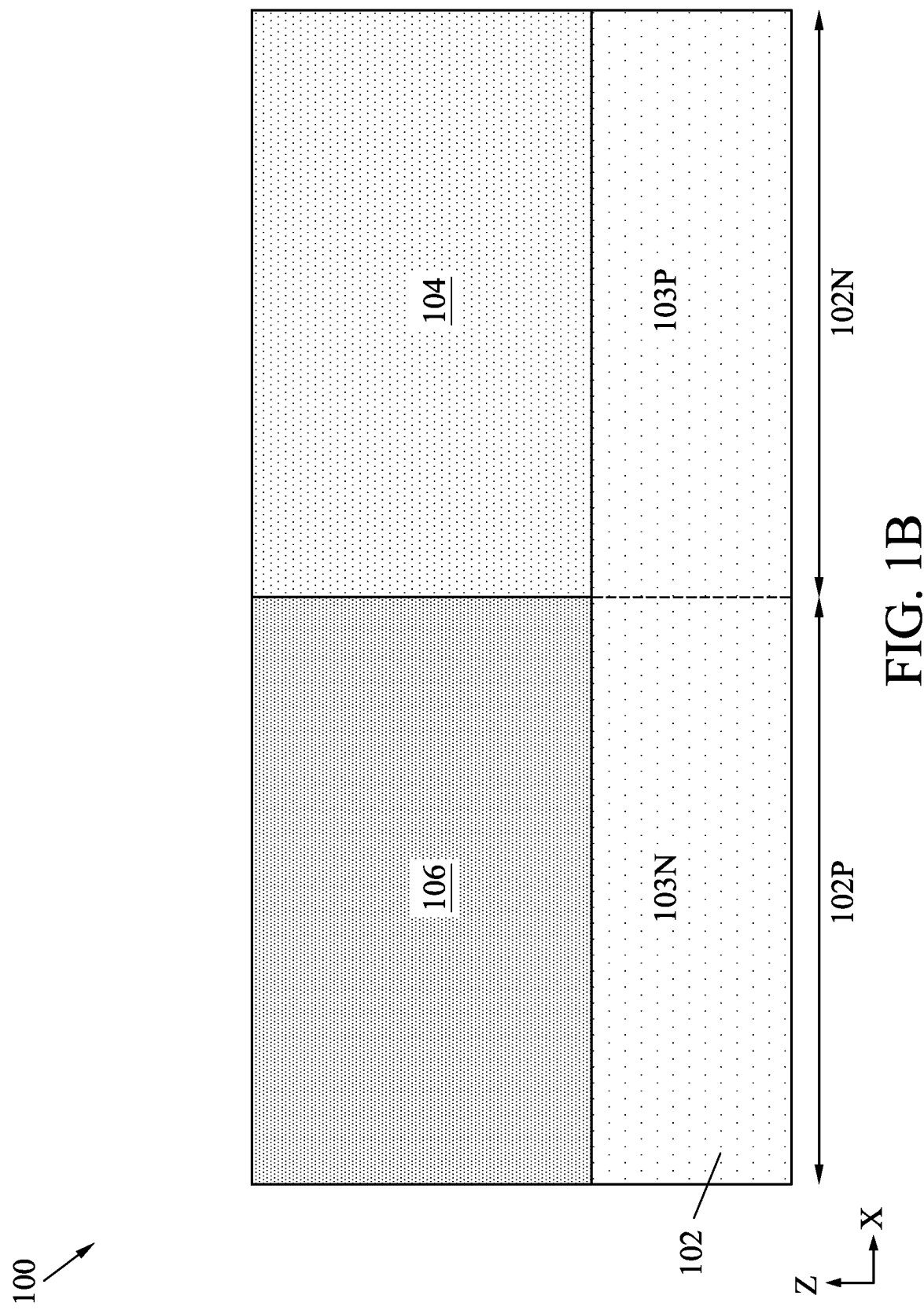

As shown in FIG. 1B, the portion of the first semiconductor layer 104 disposed over the N-well region 103N is removed, and a second semiconductor layer 106 is formed over the N-well region 103N and adjacent the portion of the first semiconductor layer 104 disposed over the P-well region 103P. A patterned mask layer (not shown) may be first formed on the portion of the first semiconductor layer 104 disposed over the P-well region 103P, and the portion of the first semiconductor layer 104 disposed over the N-well region 103N may be exposed. At least one removal process, such as a dry etch, wet etch, or a combination thereof, may be performed to remove the portion of the first semiconductor layer 104 disposed over the N-well region 103N, and the N-well region 103N may be exposed. The removal process does not substantially affect the mask layer (not shown) formed on the portion of the first semiconductor layer 104 disposed over the P-well region 103P, which protects the portion of the first semiconductor layer 104 disposed over the P-well region 103P. Next, the second semiconductor layer 106 is formed on the exposed N-well region 103N. The second semiconductor layer 106 may be made of any suitable semiconductor material, such as silicon, germanium, III-V semiconductor material, or combinations thereof. In some embodiments, the second semiconductor layer 106 is substantially made of silicon germanium. The second semiconductor layer 106 may be formed by the same process as the first semiconductor layer 104. For example, the second semiconductor layer 106 is formed on the exposed N-well region 103N by an epitaxial growth process, which does not form the second semiconductor layer 106 on the mask layer (not shown) disposed on the first semiconductor layer 104. As a result, the first semiconductor layer 104 is disposed over the P-well region 103P in the NMOS region 102N, and the second semiconductor layer 106 is disposed over the N-well region 103N in the PMOS region 102P. Portions of the first semiconductor layer 104 may serve as channels in the subsequently formed NMOS structure in the NMOS region 102N. Portions of the second semiconductor layer 106 may serve as channels in the subsequently formed PMOS structure in the PMOS region 102P. In some embodiments, the NMOS structure and the PMOS structure are FinFETs. Other types of semiconductor devices may be utilized, such as nanosheet transistors, planar FETs, complementary FETs (CFETs), forksheet FETs, or other suitable devices.

Figure 1C:
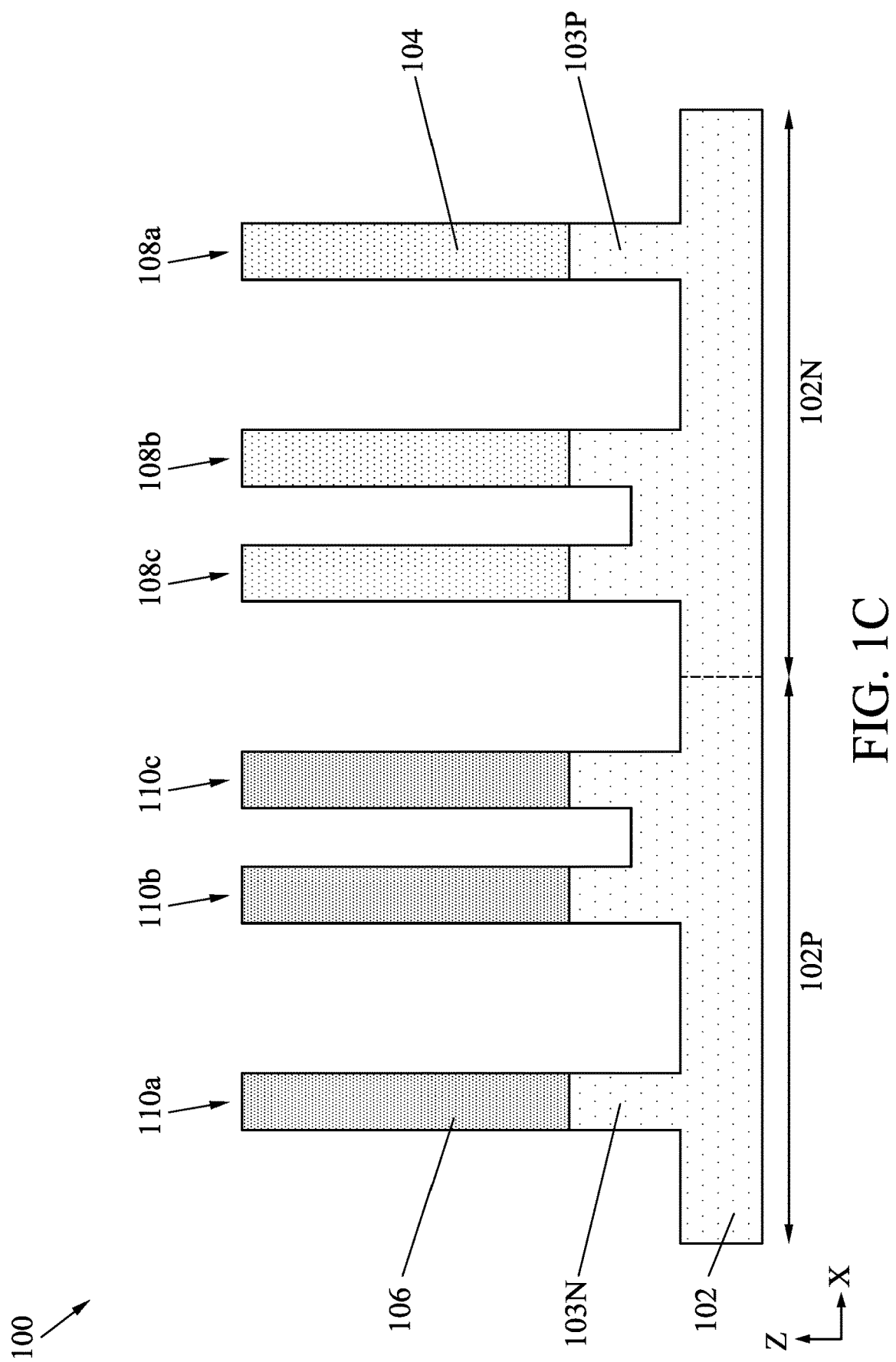

As shown in FIG. 1C, a plurality of fins 108a, 108b, 108c, 110a, 110b, 110c are formed. The fins 108a, 108b, 108c, 110a, 110b, 110c may be patterned by any suitable method. For example, the fins 108a, 108b, 108c, 110a, 110b, 110c may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not shown) is formed over a substrate and patterned using a photolithography process. Spacers (not shown) are formed alongside the patterned sacrificial layer using a self-aligned process. The sacrificial layer is then removed, and the remaining spacers may then be used to pattern the fins. In some embodiment, a liner layer may be formed over the fins 108a, 108b, 108c, 110a, 110b, 110c.

The fins 108a, 108b, 108c may each include the first semiconductor layer 104, and a portion of the first semiconductor layer 104 may serve as an NMOS channel. Each fin 108a, 108b, 108c may also include the P-well region 103P. The fins 110a, 110b, 110c may each include the second semiconductor layer 106, and a portion of the second semiconductor layer 106 may serve as a PMOS channel. Each fin 110a, 110b, 110c may also include the N-well region 103N. A mask (not shown) may be formed on the first and second semiconductor layers 104, 106, and may remain on the fins 108a-c and 110a-c. Each fin 108a-c, 110a-c may have a height along the Z-axis ranging from about 30 nm to about 80 nm.

Figure 1D:
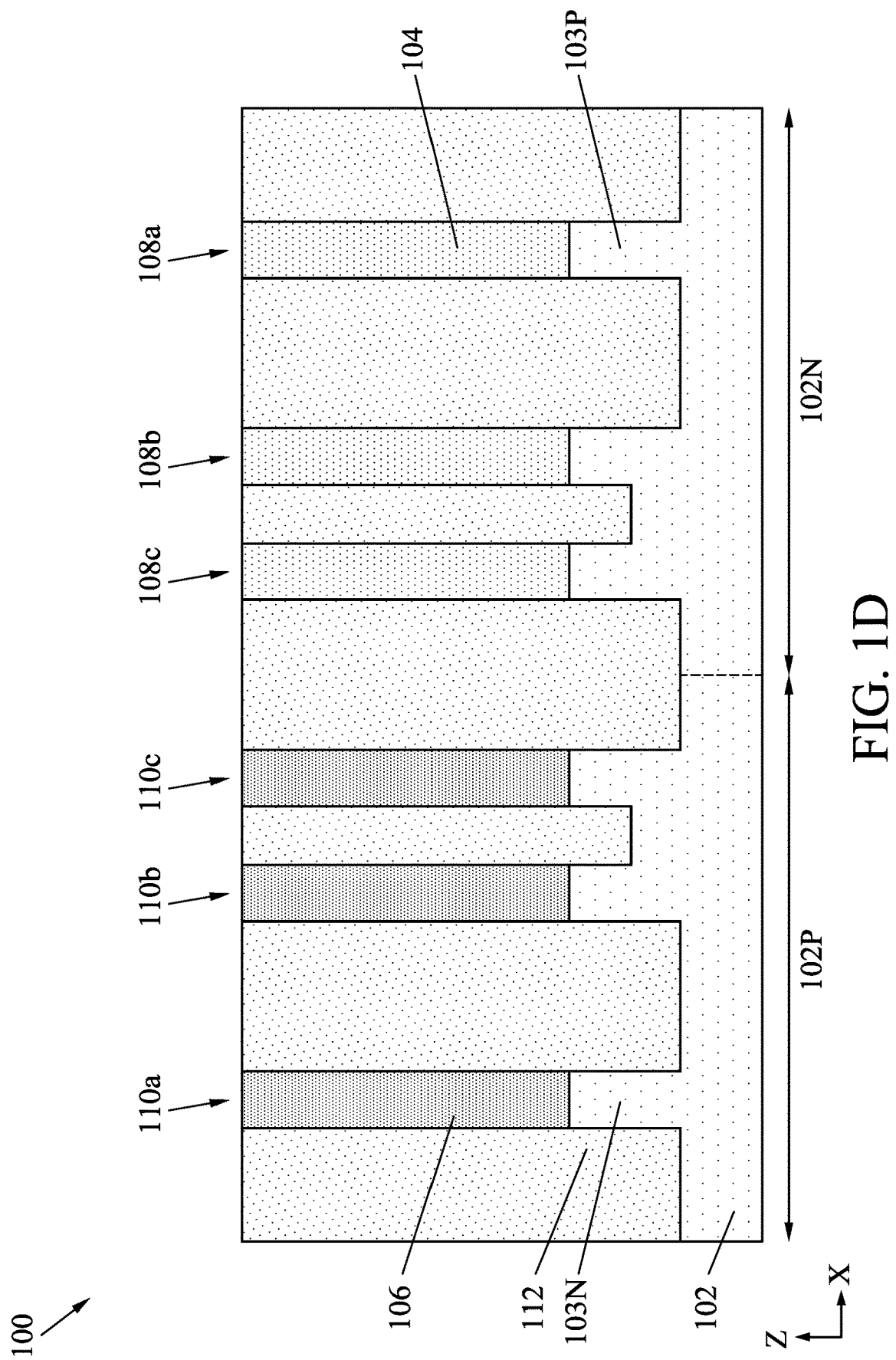

As shown in FIG. 1D, an insulating material 112 is formed between adjacent fins 108a-c, 110a-c. The insulating material 112 may be first formed between adjacent fins 108a-c, 110a-c and over the fins 108a-c, 110a-c, so the fins 108a-c, 110a-c are embedded in the insulating material 112. A planarization process, such as a chemical-mechanical polishing (CMP) process may be performed to expose the top of the fins 108a-c, 110a-c, as shown in FIG. 1D. In some embodiments, the planarization process exposes the top of the mask (not shown) disposed on the fins 108a-c and 110a-c. The insulating material 112 may include an oxygen-containing material, such as silicon oxide, carbon or nitrogen doped oxide, or fluorine-doped silicate glass (FSG); a nitrogen-containing material, such as silicon nitride, silicon oxynitride (SiON), SiOCN, SiCN; a low-K dielectric material (e.g., a material having a K value lower than that of silicon dioxide); or any suitable dielectric material. The insulating material 112 may be formed by any suitable method, such as low-pressure chemical vapor deposition (LPCVD), plasma enhanced CVD (PECVD) or flowable CVD (FCVD).

Figure 1E:
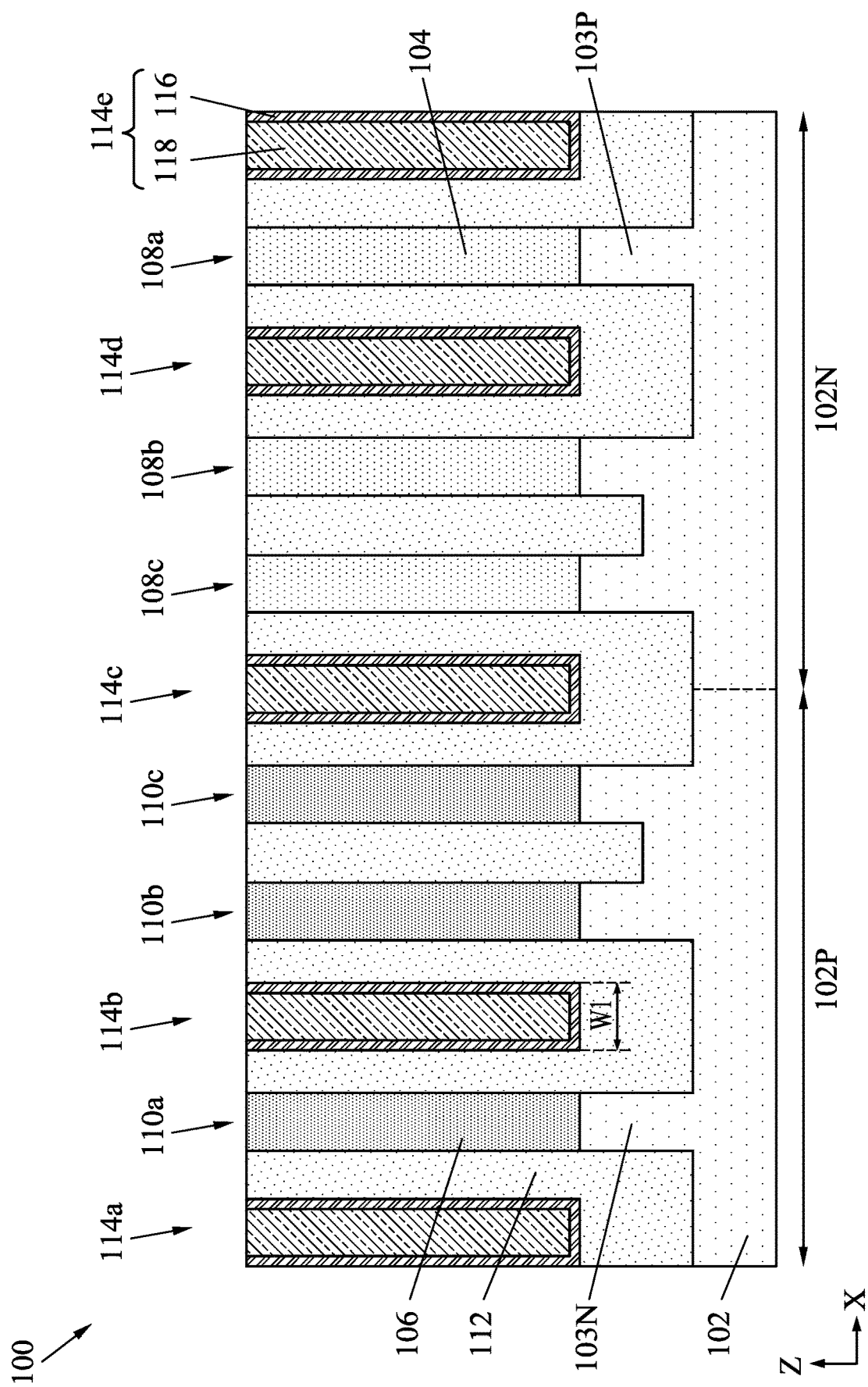

As shown in FIG. 1E, a plurality of dielectric features 114a, 114b, 114c, 114d, 114e are formed in the insulating material 112. In some embodiments, each dielectric feature 114a, 114b, 114c, 114d, 114e may include a liner 116 and a low-K dielectric material 118. The liner 116 may include a dielectric material such as $SiO_2$, SiN, SiCN, SiOC, SiOCN, or other suitable dielectric material. In some embodiments, the liner 116 includes SiCN. The liner 116 may be formed by a conformal process, such as an ALD process. In some embodiments, the liner 116 has a thickness ranging from about 3 nm to about 10 nm. The low-K dielectric material 118 may be formed on the liner 116 and between adjacent fins 108a-c, 110a-c. The low-K dielectric material 118 may include silicon, oxygen, hydrogen, and/or combinations thereof. The low-K dielectric material 118 may have a K value less than about 3.5. The low-K dielectric material 118 may be formed by any suitable process, such as CVD or FCVD. The dielectric features 114a-e may be dielectric fins that separate subsequently formed source/drain (S/D) epitaxial features and electrode layers. In some embodiments, each dielectric feature 114a-e has a width W1 ranging from about 10 nm to about 30 nm. In some embodiments, the dielectric features 114a-e may have a height along the Z-axis greater than, equal to, or less than a height of the fins 108a-c, 110a-c. In some embodiments, the insulating material 112 is conformally formed between adjacent fins 108a-c, 110a-c, and the dielectric feature 114a, 114b, 114c, 114d, 114e may be formed between gaps of the insulating material 112, as shown in FIG. 1E.

Figure 1F:
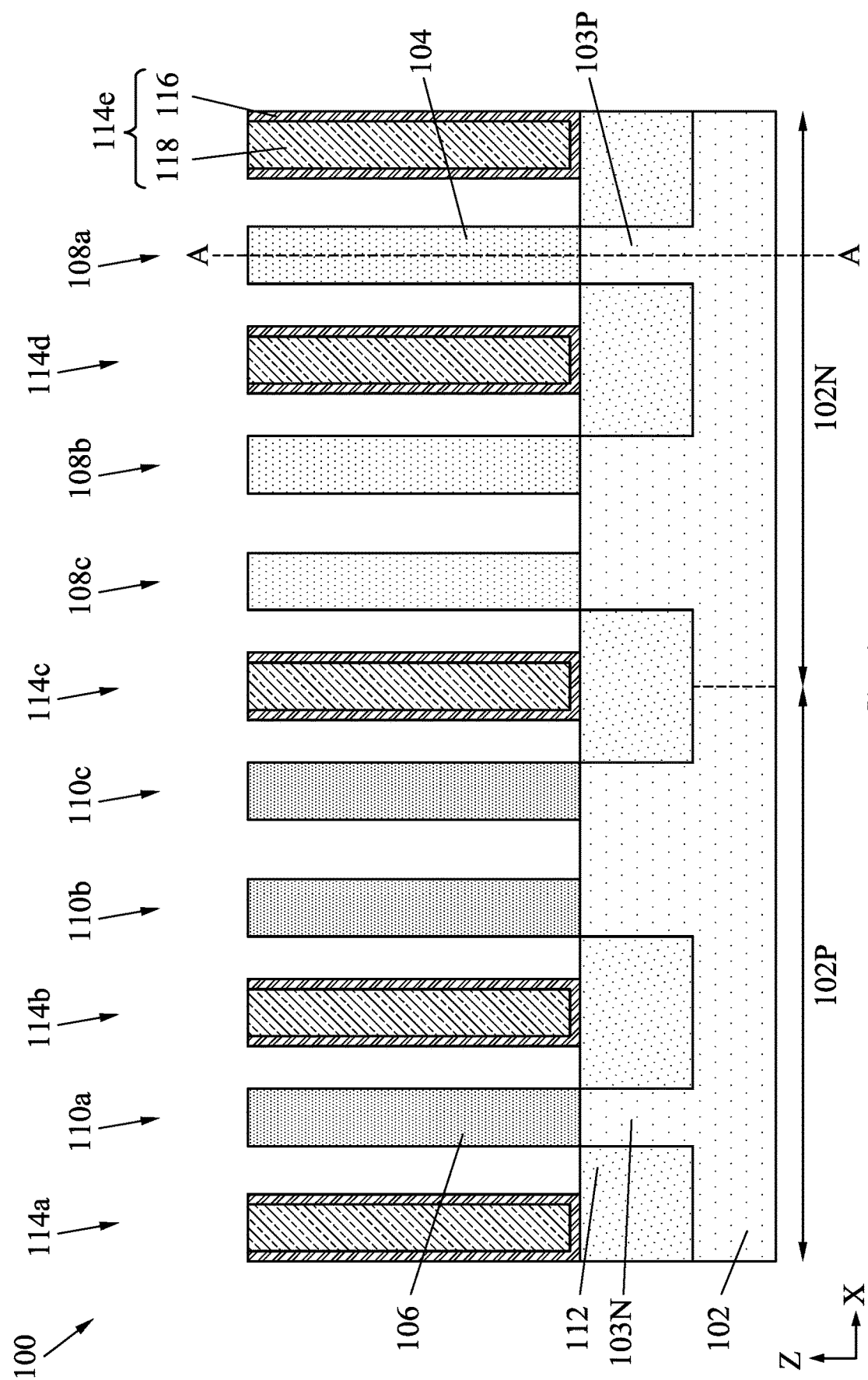

As shown in FIG. 1F, the insulating material 112 may be recessed by removing a portion of the insulating material 112 located on both sides of each fin 108a-c, 110a-c. The insulating material 112 may be recessed by any suitable removal process, such as dry etch or wet etch that selectively removes the insulating material 112 but does not substantially affect the semiconductor materials of the fins 108a-c, 110a-c, the liner 116, and the low-K dielectric material 118. The recessed insulating material 112 may be the shallow trench isolation (STI).

Figure 2A:
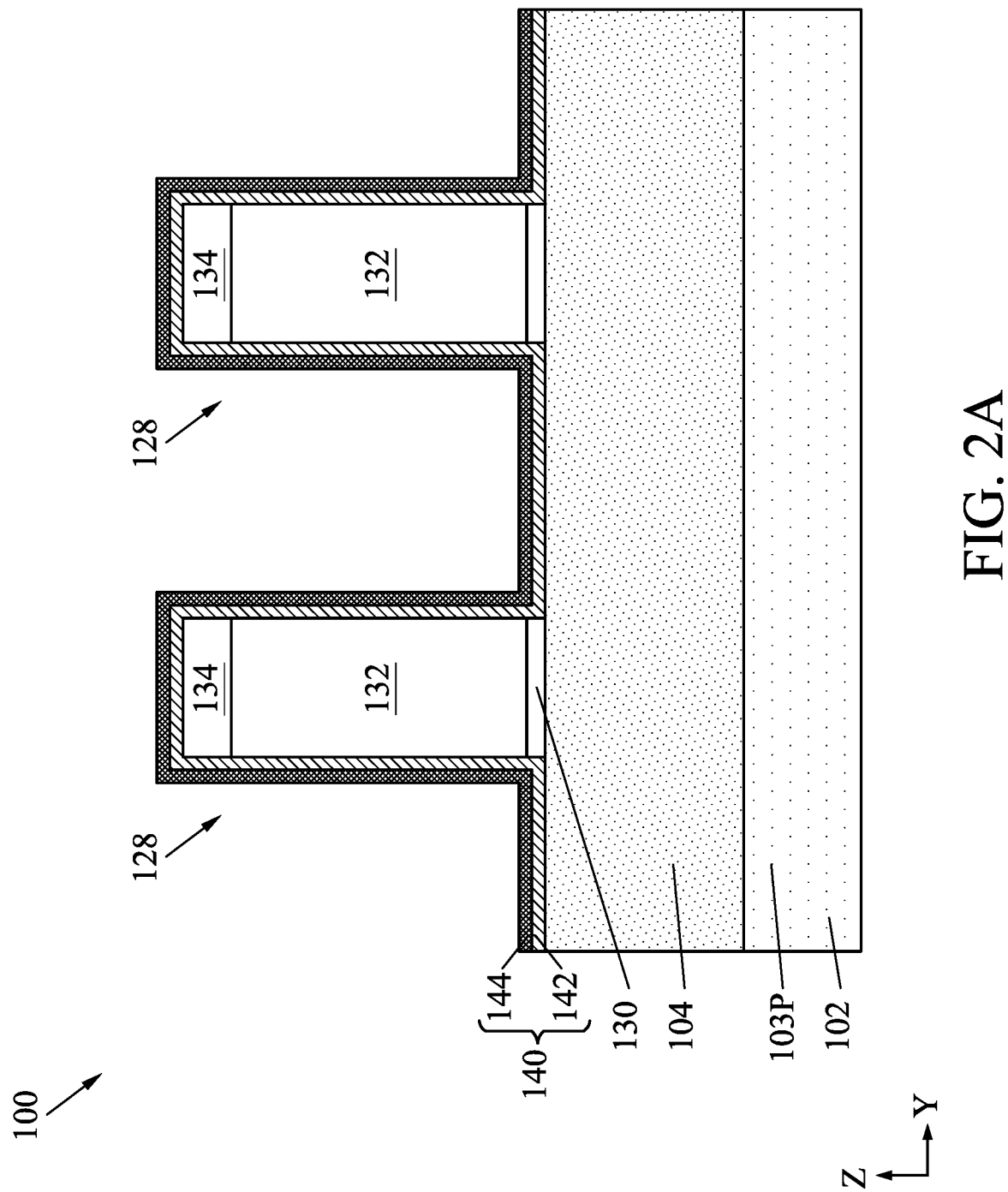
FIGS. 2A, 3A, 4A, 5A, and 6A are cross-sectional side views of various stages of manufacturing the semiconductor device structure of FIG. 2B taken along line A-A, in accordance with some embodiments.

FIGS. 2A-6A are cross-sectional side views of various stages of manufacturing the semiconductor device structure 100 of FIG. 1F taken along line A-A, in accordance with some embodiments. FIGS. 2B-6B are cross-sectional side views of various stages of manufacturing the semiconductor device structure 100, in accordance with some embodiments. As shown in FIGS. 2A and 2B, one or more sacrificial gate stacks 128 are formed on a portion of the fins 108a-c, 110a-c and dielectric features 114a-e, and a spacer 140 is formed on the sacrificial gate stacks 128, the exposed portions of the dielectric features 104a-e, the exposed portions of the second semiconductor layer 106, the exposed portions of the first semiconductor layer 104, and the insulating material 112. Each sacrificial gate stack 128 may include a sacrificial gate dielectric layer 130, a sacrificial gate electrode layer 132, and a mask structure 134. The sacrificial gate dielectric layer 130 may include one or more layers of dielectric material, such as $SiO_2$, SiN, a high-K dielectric material, and/or other suitable dielectric material. In some embodiments, the sacrificial gate dielectric layer 130 includes a material different from that of the insulating material 112. In some embodiments, the sacrificial gate dielectric layer 130 may be deposited by a CVD process, a sub-atmospheric CVD (SACVD) process, a FCVD process, an ALD process, a PVD process, or other suitable process. The sacrificial gate electrode layer 132 may include polycrystalline silicon (polysilicon). The mask structure 134 may include an oxygen-containing layer and a nitrogen-containing layer. In some embodiments, the sacrificial gate electrode layer 132 and the mask structure 134 are formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 128 may be formed by first depositing blanket layers of the sacrificial gate dielectric layer 130, the sacrificial gate electrode layer 132, and the mask structure 134, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stacks 128, the fins 108a-c, 110a-c are partially exposed on opposite sides of the sacrificial gate stacks 128. As illustrated in FIG. 2A, two sacrificial gate stacks 128 are formed, which is for illustrative purpose and not intended to be limiting beyond what is specifically recited in the claims. It can be appreciated that any number of the sacrificial gate stacks 128 may be formed. The sacrificial gate stacks 128 may also cover a portion of each of the dielectric features 104a-e, and the dielectric features 104a-e are partially exposed on opposite sides of the sacrificial gate stacks 128.

Figure 2B:
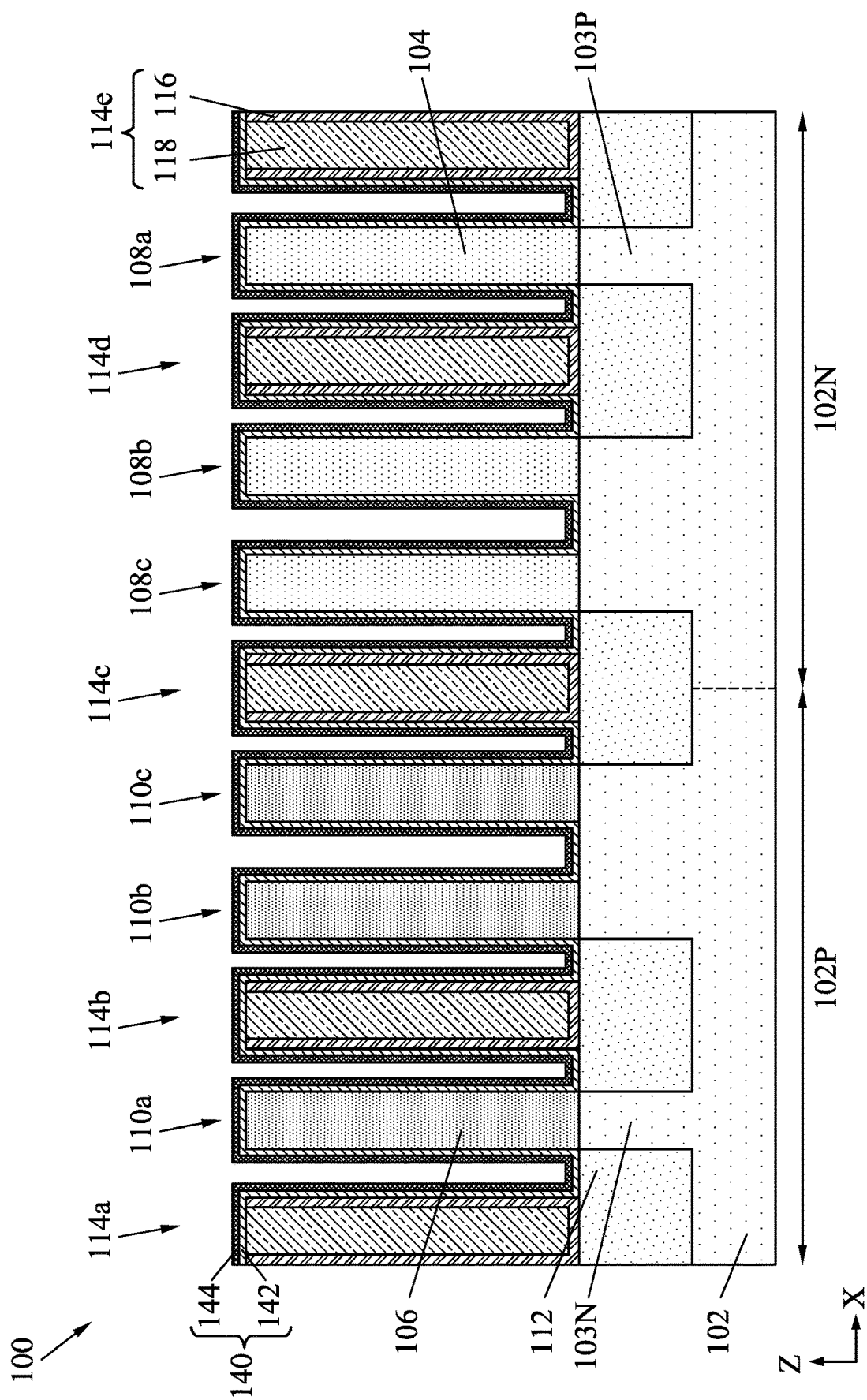
FIGS. 2B, 3B, 4B, 5B, and 6B are cross-sectional side views of various stages of manufacturing the semiconductor device structure of FIG. 2B taken along line B-B, in accordance with some embodiments.

In some embodiments, the spacer 140 includes a first layer 142 and a second layer 144, as shown in FIGS. 2A and 2B. The first and second layers 142, 144 may be conformally deposited on the exposed surfaces of the semiconductor device structure 100. The conformal first and second layers 142, 144 may be formed by ALD processes. The first and second layers 142, 144 may be made of a dielectric material such as silicon oxide, silicon nitride, silicon carbide, silicon oxynitride, SiCN, silicon oxycarbide, SiOCN, and/or combinations thereof. In some embodiments, the first and second layers 142, 144 include different materials. In some embodiments, the spacer 140 is a single layer. In some embodiments, the spacer 140 includes more than two layers. As shown in FIG. 2B, the spacer 140 is also formed on the exposed portions of the second semiconductor layer 106 and the dielectric features 104a-e.

Figure 3A:
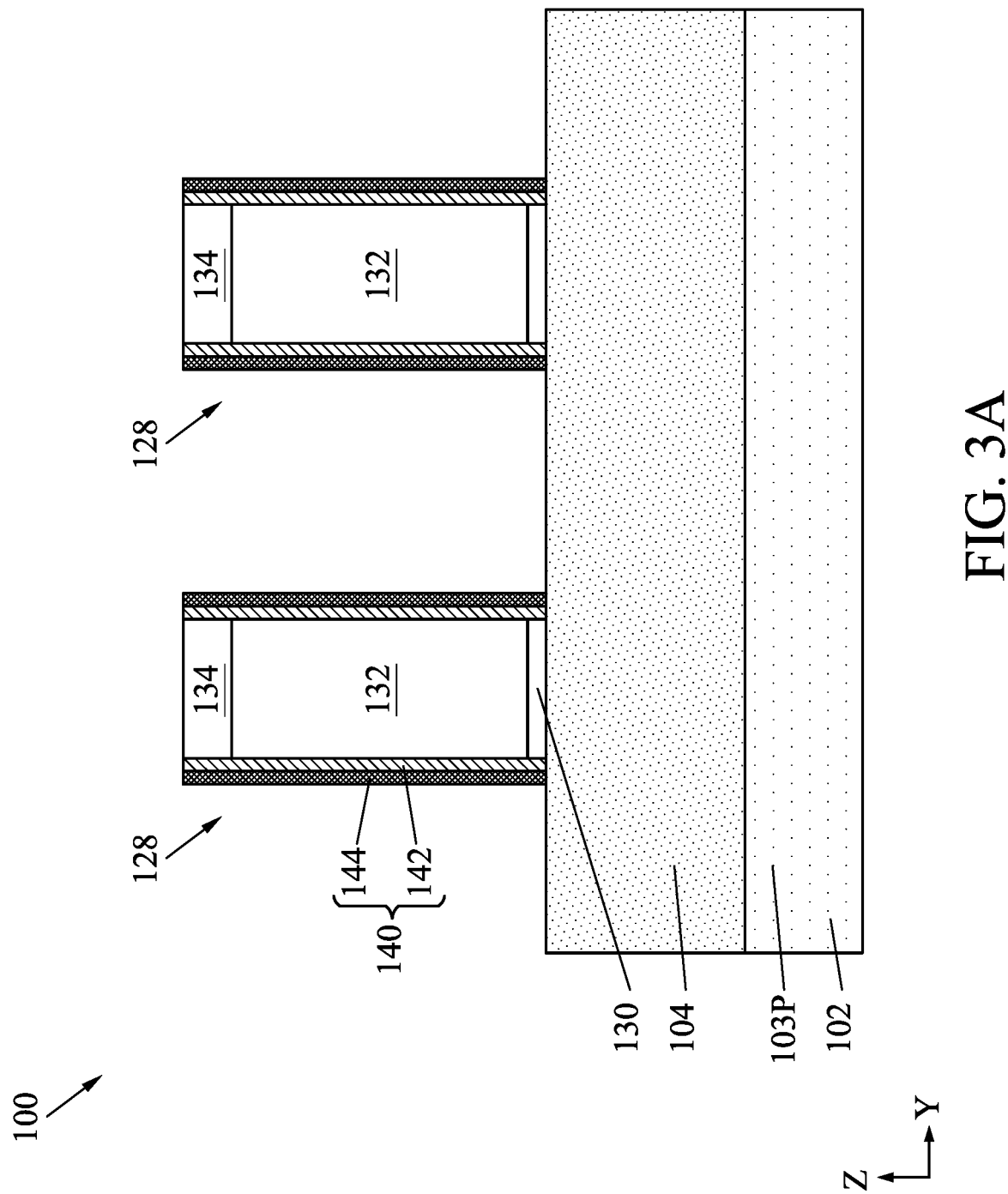
Figure 3B:
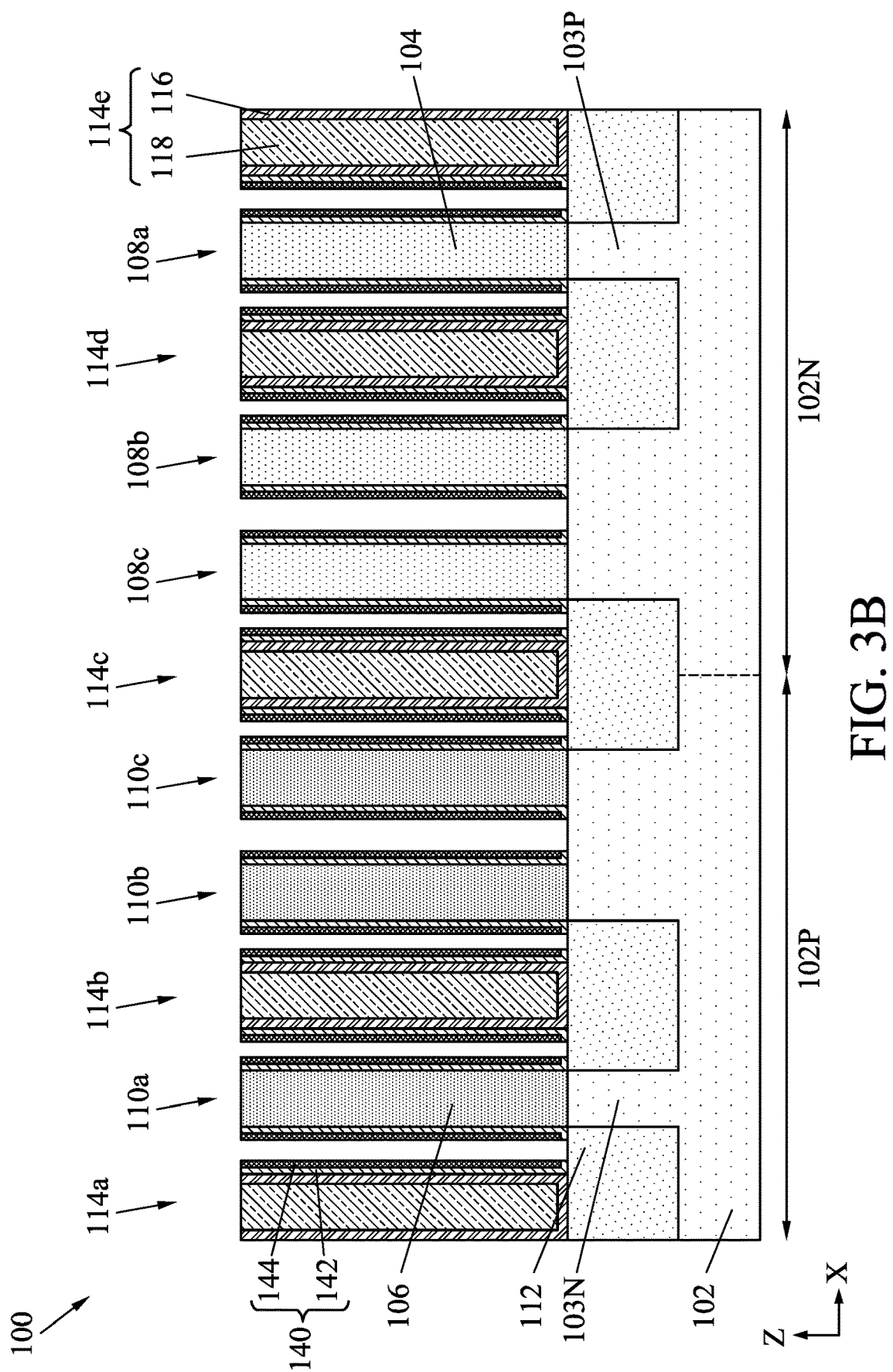

As shown in FIGS. 3A and 3B, an anisotropic etch is performed on the spacer 140 using, for example, RIE. During the anisotropic etch process, most of the spacer 140 is removed from horizontal surfaces, such as tops of the sacrificial gate stacks 128, tops of the fins 108a-c, 110a-c, and tops of the dielectric features 114a-e, leaving the spacer 140 on the vertical surfaces, such as the sidewalls of sacrificial gate stacks 128, sidewalls of the fins 108a-c, 110a-c, and sidewalls of the dielectric features 114a-e.

Figure 4A:
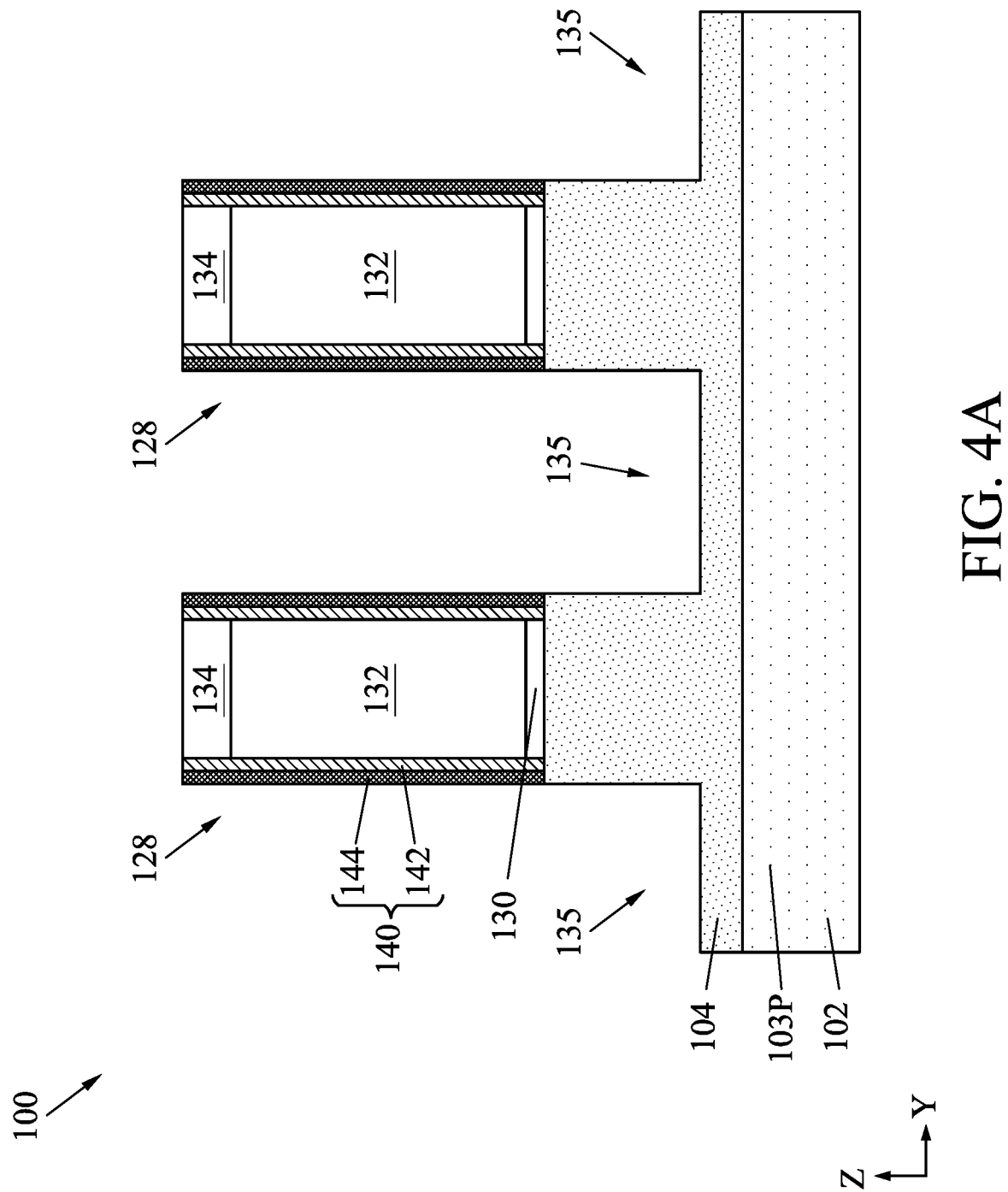
Figure 4B:
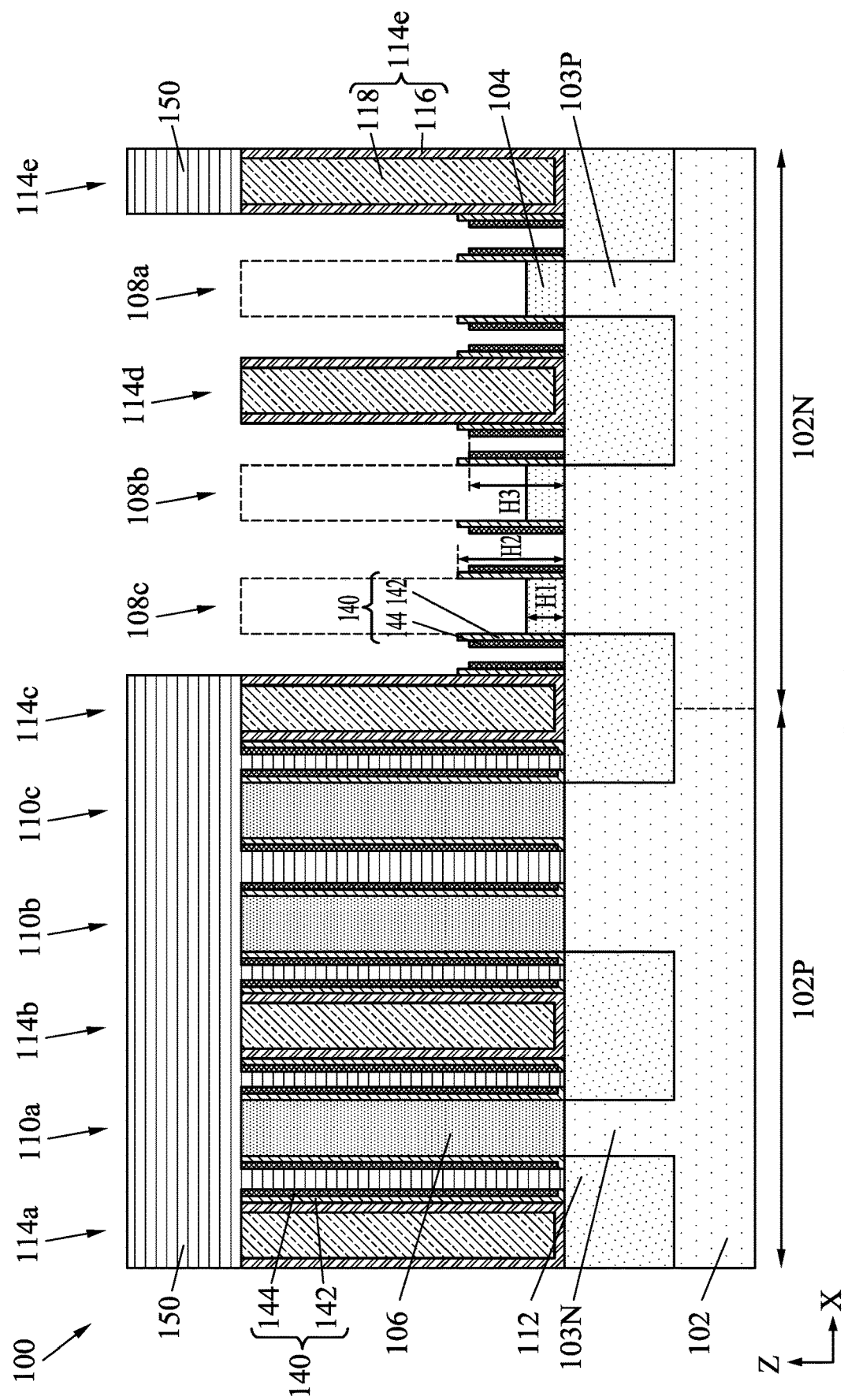

As shown in FIGS. 4A and 4B, a mask 150 is formed on the PMOS region 102P and on the dielectric feature 114e which may separate the NMOS region 102N from another PMOS region 102P (not shown), and the exposed materials not covered by the sacrificial gate stacks 128 and the mask 150, such as exposed portions of the fins 108a-c and the spacer 140 disposed on the sidewalls of the fins 108a-c and the dielectric feature 114d are recessed to form openings 135. In some embodiments, the dielectric feature 114d is also recessed. In some embodiments, the dielectric feature 114d is substantially not affected, as shown in FIG. 4B. A sacrificial liner (not shown) may be formed on the PMOS region 102P and the dielectric feature 114e, and the mask 150 is formed on the sacrificial liner. The mask 150 may be a patterned photoresist layer. As shown in FIG. 4B, the fins 108a-c covered by the sacrificial gate stacks 128 are shown in dotted lines. The recess of the materials may be performed by multiple etch processes. For example, a first etch process is performed to recess the spacer 140 and a second etch process is performed to recess the fins 108a-c. The recessing of the spacer 140 and the fins 108a-c may be performed in any suitable order. In some embodiments, the first etch process is a selective etch process that recesses the spacer 140 but not the other materials of the semiconductor device structure 100, and the second etch process is a selective etch process that recesses the fins 108a-c but not the other materials of the semiconductor device structure 100. In some embodiments, a third etch process is performed to recess the dielectric feature 114d. In some embodiments, the selective etch processes are plasma etch processes. Separate selective etch processes to recess the features lead to improved controlling of the dimensions of the resulting features.

In some embodiments, the remaining fins 108a-c has a height H1 ranging from about 5 nm to about 10 nm. The remaining first layer 142 has a height H2 ranging from about 15 nm to about 20 nm, and the remaining second layer 144 has a height H3 ranging from about 10 nm to about 15 nm. In some embodiments, the difference between the height H2 and the height H3 ranges from about 1 nm to about 5 nm in order to control the shape of the subsequently formed S/D epitaxial features 152 (FIGS. 5A and 5B).

Figure 5A:
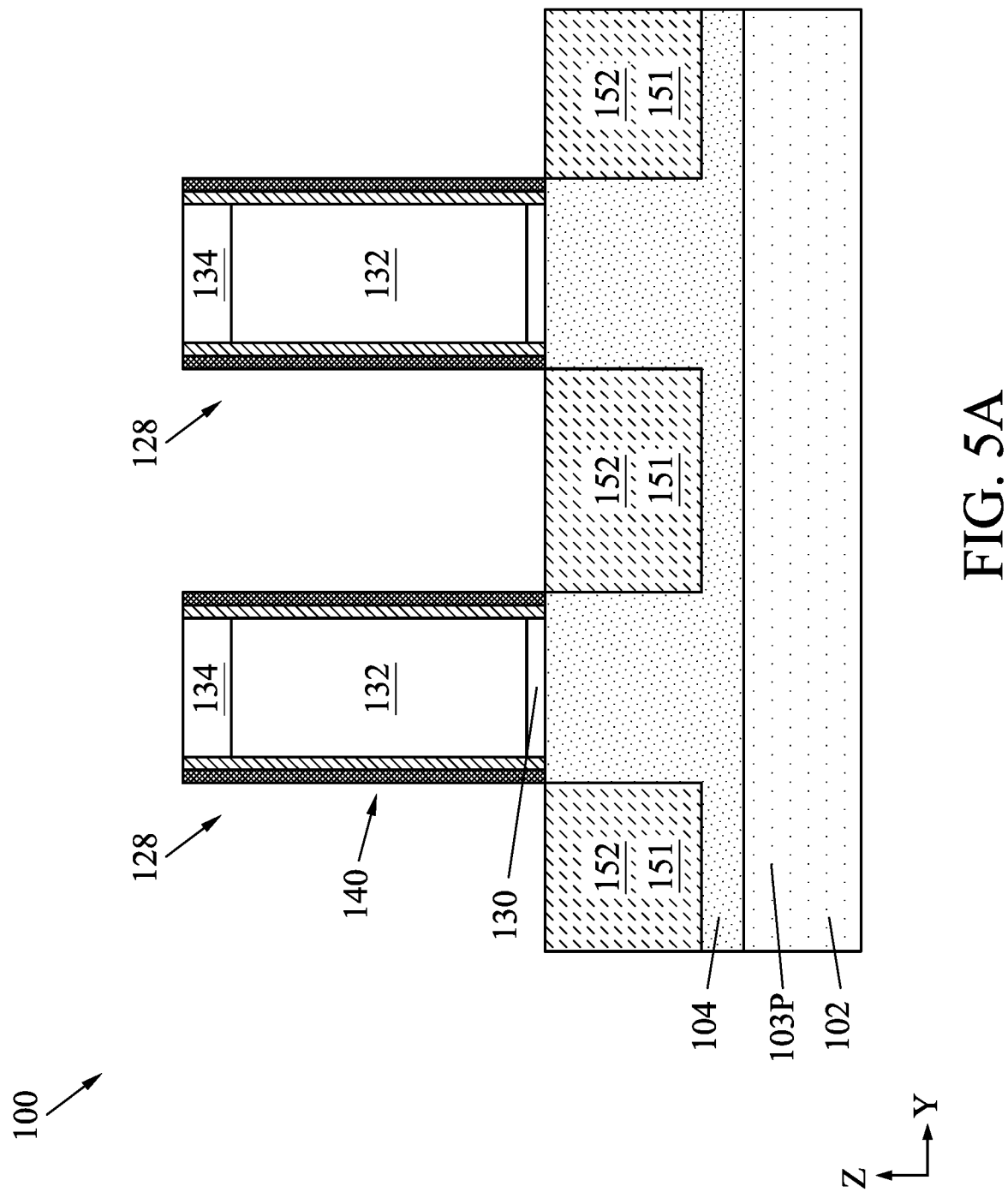
Figure 5B:
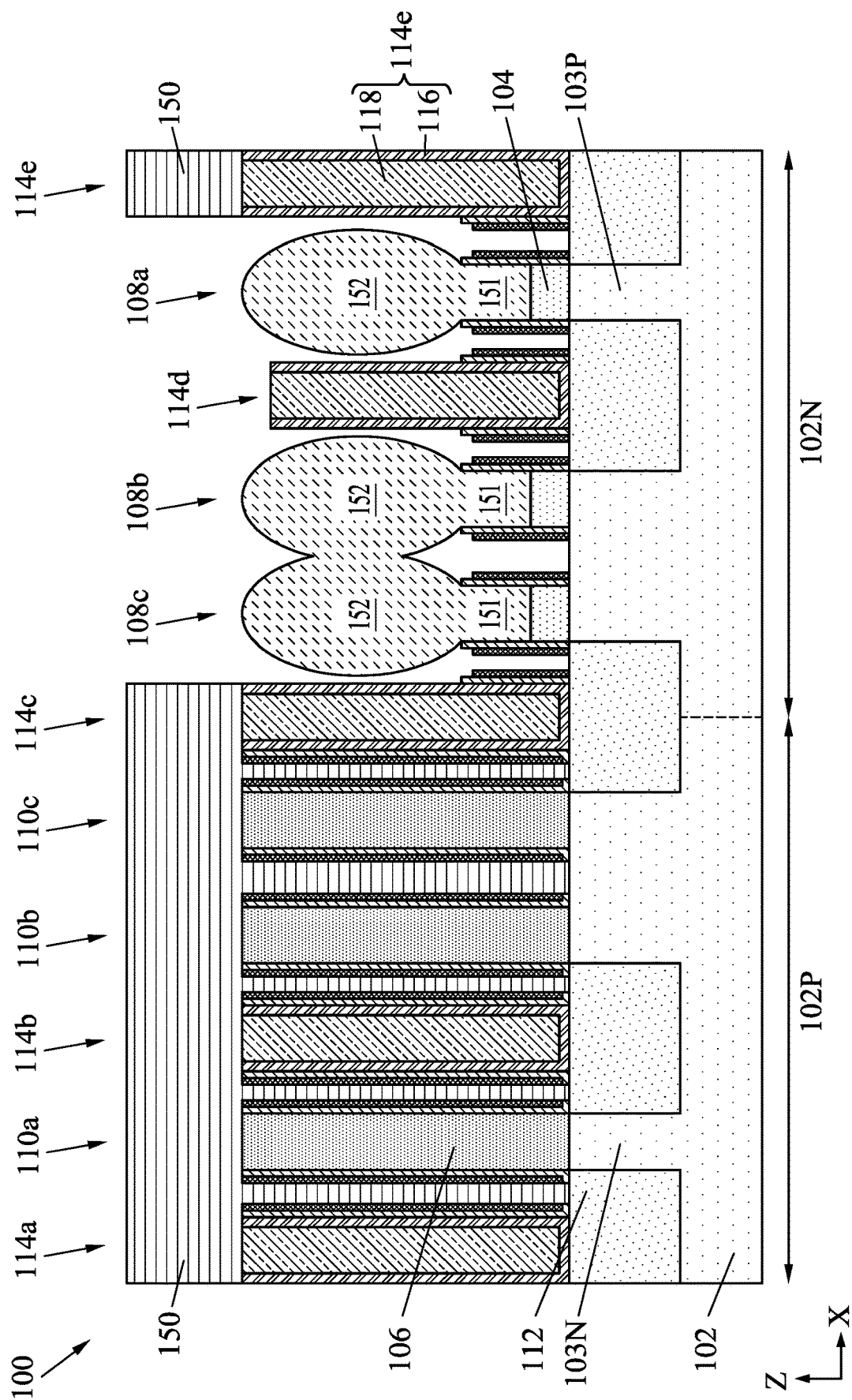

As shown in FIGS. 5A and 5B, lightly doped epitaxial layers 151 and the S/D epitaxial features 152 are formed. In some embodiments, each lightly doped epitaxial layers 151 may include SiP or SiAs and each S/D epitaxial features 152 may include one or more layers of Si, SiP, SiC, or SiCP for NMOS devices. In some embodiments, the lightly doped epitaxial layer 151 includes SiP or SiAs doped with phosphorous having a dopant concentration ranging from about 1E20 at/cm$^3$ to about 4E21 at/cm$^3$. The S/D epitaxial feature 152 may include a main layer and a cap layer (not shown). In some embodiments, the main layer includes SiP with phosphorous concentration ranging from about 5E20 at/cm$^3$ to about 4E21 at/cm$^3$, and the cap layer includes SiP with phosphorous concentration ranging from about 1E21 at/cm$^3$ to about 2E21 at/cm$^3$. In some embodiments, the dopant concentration of the cap layer is substantially less than the dopant concentration of the main layer. The main layer may have a thickness along the Z axis ranging from about 30 nm to about 60 nm, and the cap layer may have a thickness ranging from about 5 nm to about 10 nm.

The lightly doped layers 151 and the S/D epitaxial features 152 may be formed by any suitable method, such as CVD, CVD epitaxy, MBE, or other suitable method. In some embodiments, the S/D epitaxial features 152 are formed by a reduced pressure CVD process using SiH$_4$, SiH$_2$Cl$_2$, GeH$_4$, PH$_3$, B$_2$H$_6$, HCl, and/or H$_2$ as precursor gases at a processing temperature ranging from about 600 degrees Celsius to about 700 degrees Celsius. The lightly doped layers 151 and the S/D epitaxial features 152 may be formed on the remaining portion of the first semiconductor layer 104 of the fins 108a-c on both sides of each sacrificial gate stack 128, as shown in FIGS. 5A and 5B.

Figure 8A:
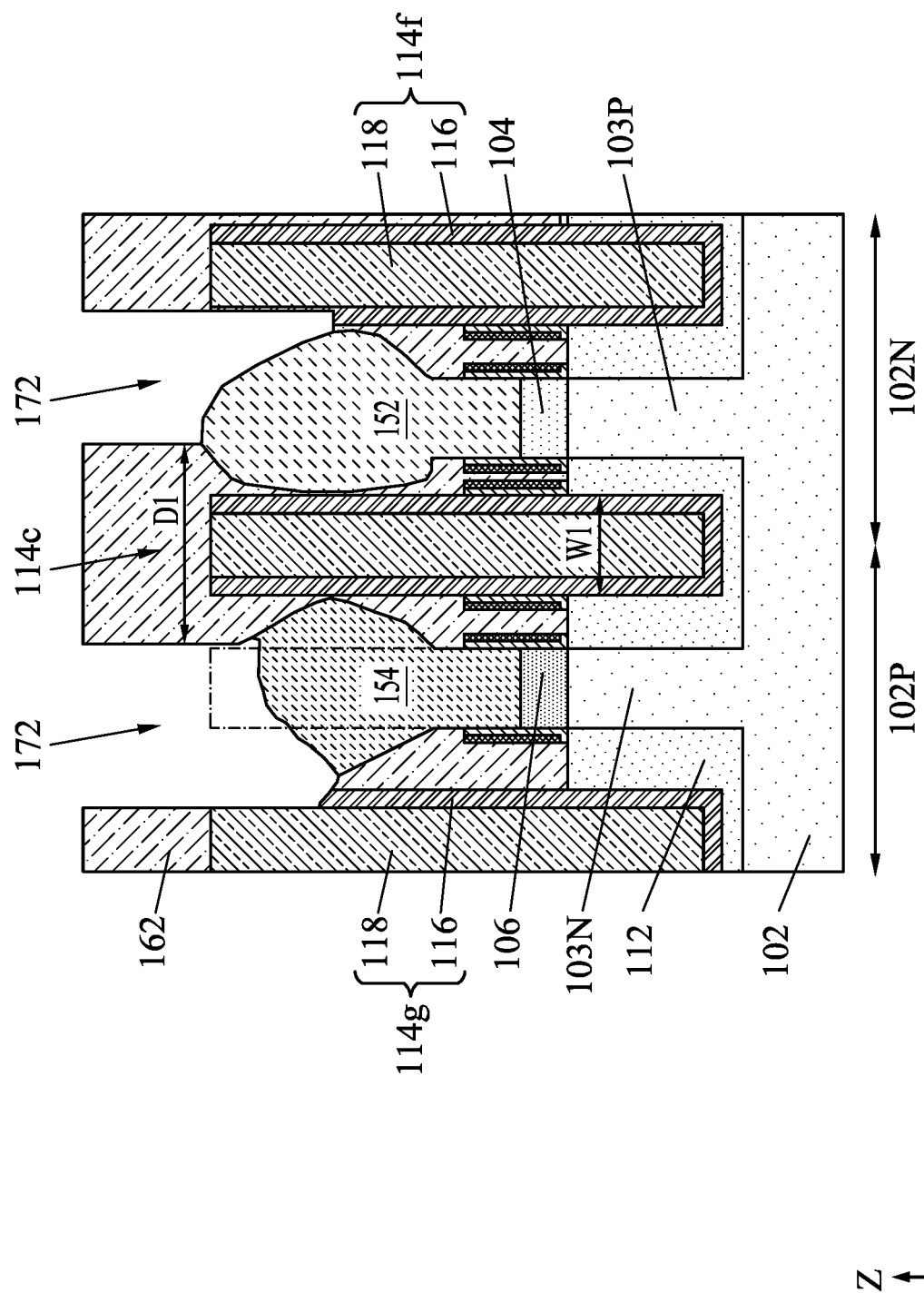
FIGS. 8A and 8B are cross-sectional side views of various stages of manufacturing the semiconductor device structure, in accordance with some embodiments.
Figure 8B:
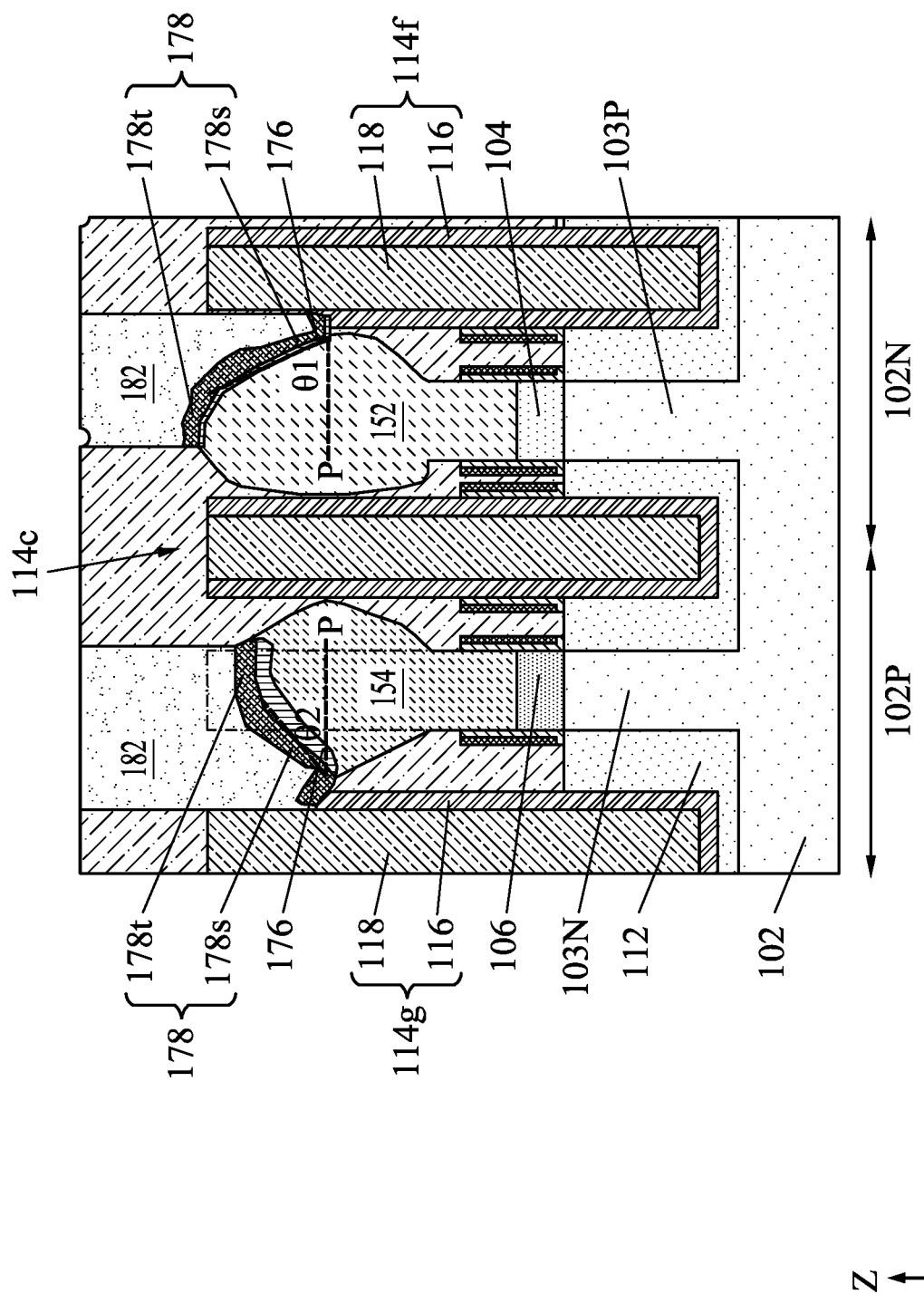

In some embodiments, the S/D epitaxial features 152 formed over the remaining portion of the first semiconductor layer 104 of the fins 108b and 108c are merged, as shown in FIG. 5B, and the S/D epitaxial feature 152 formed over the remaining portion of the first semiconductor layer 104 of the fin 108a is separated from the S/D epitaxial feature 152 formed over the remaining portion of the first semiconductor layer 104 of the fin 108b by the dielectric feature 114d. In some embodiments, the two merged S/D epitaxial features 152 and one separate S/D epitaxial feature 152 are part of a ring oscillator (RO) device. In some embodiments, the S/D epitaxial features 152 are not merged, as shown in FIGS. 8A and 8B.

Figure 6A:
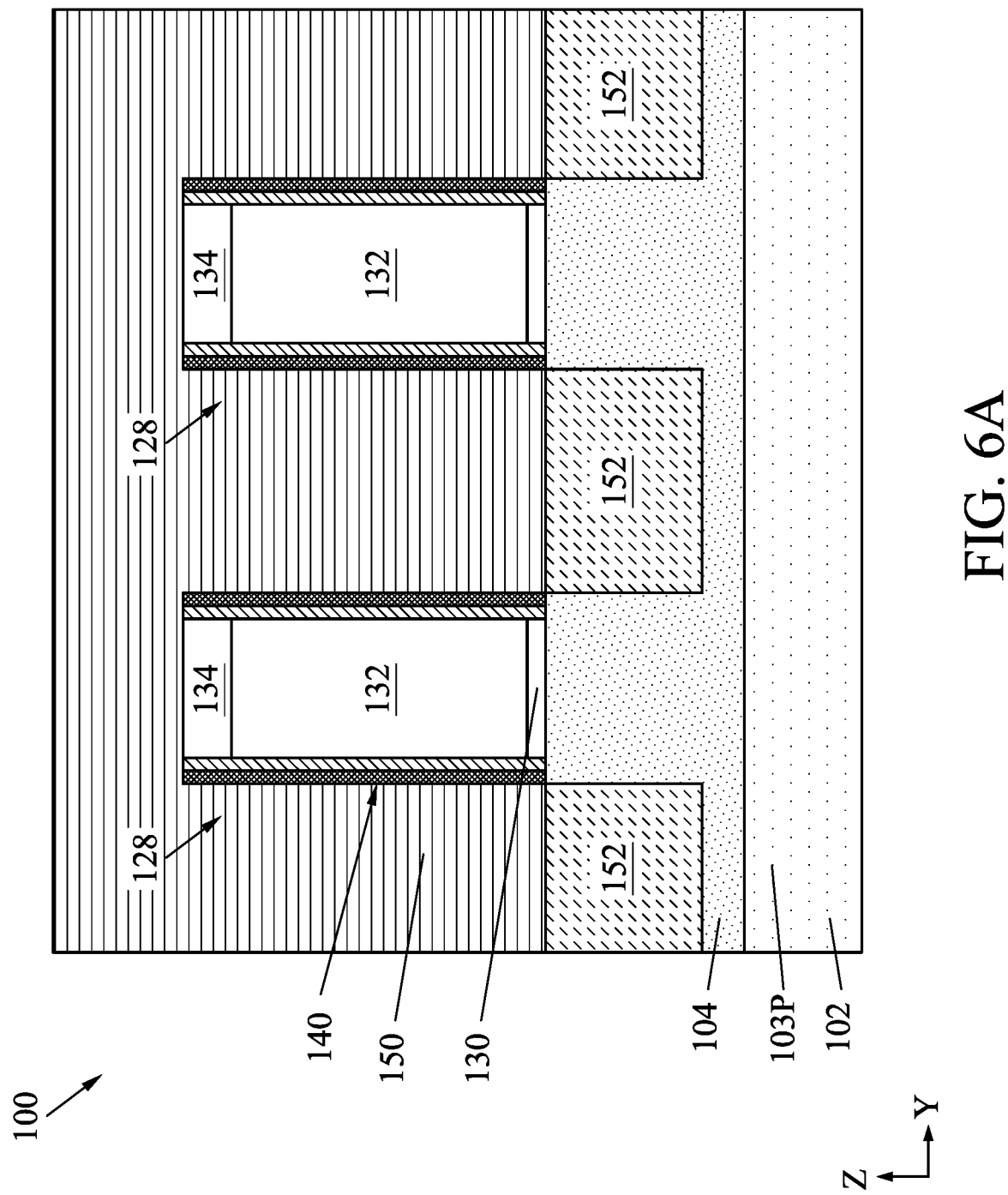
Figure 6B:
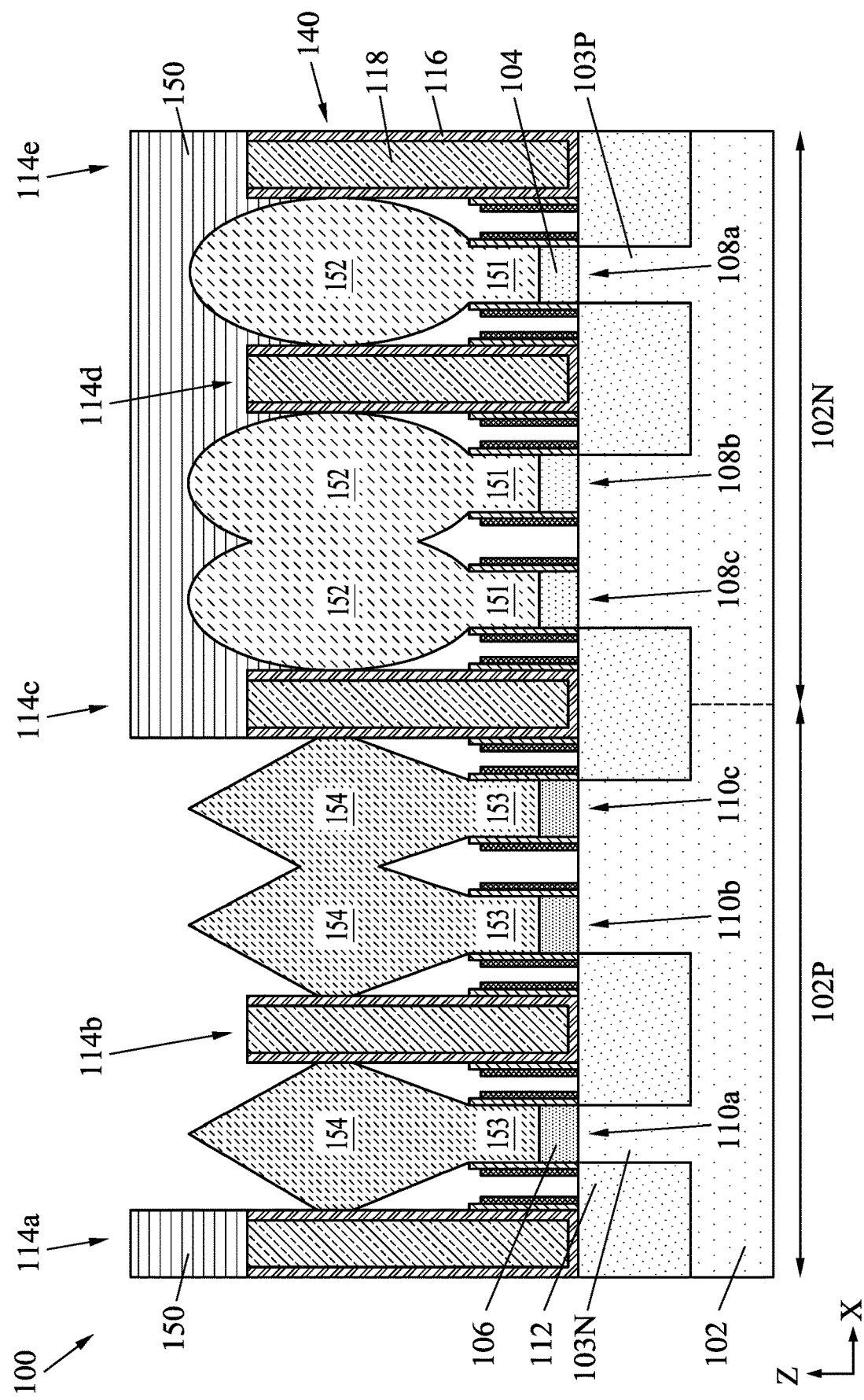

As shown in FIGS. 6A and 6B, the mask 150 formed on the PMOS region 102P is removed to expose the fins 110a-c (FIG. 5B) and the dielectric feature 114b, and the mask 150 is formed on the NMOS region 102N and on the S/D epitaxial features 152 and the dielectric features 114a, 114c, 114d, 114e. Next, the exposed materials not covered by the sacrificial gate stacks 128 and the mask 150, such as exposed portions of the fins 110a-c and the spacer 140 disposed on the sidewalls of the fins 110a-c and the dielectric feature 114b, are recessed, as shown in FIG. 6B. In some embodiments, the dielectric feature 114b is also recessed. The recess of the materials may be performed by the same processes described in FIGS. 4A and 4B. For example, a first etch process is performed to recess the spacer 140, and a second etch process is performed to recess the fins 110a-c. The recessing of the spacer 140 and the fins 110a-c may be performed in any suitable order. In some embodiments, the first etch process is a selective etch process that recesses the spacer 140 but not the other materials of the semiconductor device structure 100, and the second etch process is a selective etch process that recesses the fins 110a-c but not the other materials of the semiconductor device structure 100. In some embodiments, a third etch process is performed to recess the dielectric feature 114b. In some embodiments, the three selective etch processes are plasma etch processes. Separate selective etch processes to recess the features lead to improved controlling of the dimensions of the resulting features. The dimensions of the fins 110a-c, the first layer 142, and the second layer 144 after the etch processes may have dimensions similar to those of the fins 108a-c, the first layer 142, and the second layer 144 shown in FIG. 4B.

As shown in FIG. 6B, lightly doped epitaxial layers 153 and S/D epitaxial features 154 are formed. In some embodiments, each lightly doped epitaxial layers 153 may include SiGe: B and each S/D epitaxial features 154 may include one or more layers of Si,SiGe, SiGe: B, or Ge for PMOS devices. In some embodiments, the lightly doped epitaxial layer 153 includes boron doped SiGe with a dopant concentration ranging from about 1E20 at/cm$^3$ to about 8E20 at/cm$^3$. The germanium concentration may range from about 15 atomic percent to about 35 atomic percent. The S/D epitaxial feature 154 may include a main layer and a cap layer. In some embodiments, the main layer includes boron doped SiGe with boron concentration ranging from about 8E20 at/cm$^3$ to about 3E21 at/cm$^3$, and the germanium concentration of the main layer ranges from about 25 atomic percent to about 60 atomic percent. The cap layer includes boron doped SiGe with boron concentration ranging from about 1E21 at/cm$^3$ to about 2E21 at/cm$^3$, and the germanium concentration of the cap layer ranges from about 45 atomic percent to about 55 atomic percent. In some embodiments, the dopant concentration of the cap layer is substantially less than the dopant concentration of the main layer. The main layer may have a thickness along the Z axis ranging from about 30 nm to about 60 nm, and the cap layer may have a thickness ranging from about 5 nm to about 10 nm. In some embodiments, the thickness of the S/D epitaxial feature 152 is about 1 nm to about 10 nm greater than the thickness of the S/D epitaxial feature 154.

The lightly doped epitaxial layers 153 and the S/D epitaxial features 154 may be formed by any suitable method, such as CVD, CVD epitaxy, MBE, or other suitable method. In some embodiments, the S/D epitaxial features 154 are formed by a reduced pressure CVD process using SiH$_4$, SiH$_2$Cl$_2$, GeH$_4$, PH$_3$, BH$_3$, HCl, and/or H$_2$ as precursor gases at a processing temperature ranging from about 600 degrees Celsius to about 700 degrees Celsius. The lightly doped epitaxial layers 153 and the S/D epitaxial features 154 may be formed on the remaining portion of the second semiconductor layer 106 of the fins 110a-c on both sides of each sacrificial gate stack 128, as shown in FIG. 6B.

In some embodiments, the S/D epitaxial features 154 formed over the remaining portion of the second semiconductor layer 106 of the fins 110b and 110c are merged, as shown in FIG. 6B, and the S/D epitaxial feature 154 formed over the remaining portion of the second semiconductor layer 106 of the fin 110a is separated from the S/D epitaxial feature 152 formed over the remaining portion of the second semiconductor layer 106 of the fin 110b by the dielectric feature 114b. In some embodiments, the two merged S/D epitaxial features 154 and one separate S/D epitaxial feature 154 are part of an RO device. In some embodiments, the S/D epitaxial features 154 are not merged, as shown in FIGS. 8A and 8B. The S/D epitaxial features 152, 154 may be source/ drain regions. In this disclosure, a source region and a drain region are interchangeably used, and the structures thereof are substantially the same. Furthermore, S/D region(s) may refer to a source or a drain, individually or collectively dependent upon the context.

Figure 7A:
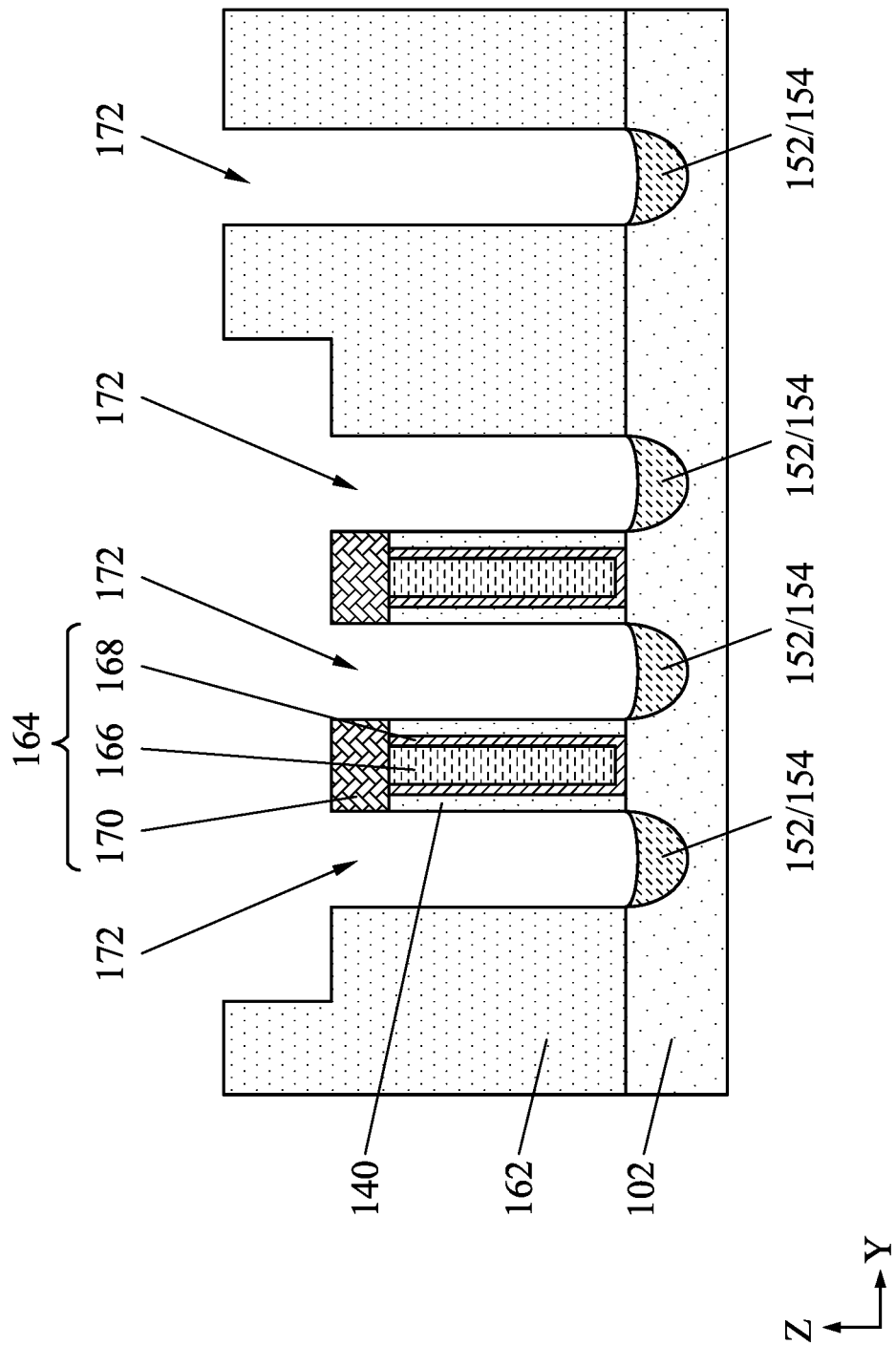
FIGS. 7A, 7B, 7C, 7D, 7E, 7F, 7G, and 7H are cross-sectional side views of various stages of manufacturing the semiconductor device structure, in accordance with some embodiments.

FIGS. 7A to 7H are cross-sectional side views of various stages of manufacturing the semiconductor device structure 100, in accordance with some embodiments. As shown in FIG. 7A, the mask 150 is removed, a contact etch stop layer (CESL) (not shown) may be formed on the S/D epitaxial features 154, 152 and the dielectric features 114*a-e*, and an interlayer dielectric (ILD) layer 162 is be formed on the CESL. The CESL may include an oxygen-containing material or a nitrogen-containing material, such as silicon nitride, silicon carbon nitride, silicon oxynitride, carbon nitride, silicon oxide, silicon carbon oxide, the like, or a combination thereof. The CESL may be formed by CVD, PECVD, ALD, or any suitable deposition technique. The ILD layer 162 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 162 may be deposited by a PECVD process or other suitable deposition technique. In some embodiments, after formation of the ILD layer 162, the semiconductor device structure 100 may be subject to a thermal process to anneal the ILD layer 162. A planarization process may be performed after forming the ILD layer 162 to expose the sacrificial gate electrode layers 132.

Next, replacement gate process may be performed to replace the sacrificial gate stacks 128 (FIG. 6A) with gate stacks 164 including gate dielectric layers 168 and gate electrode layers 166. The sacrificial gate electrode layers 132 and the sacrificial gate dielectric layers 130 may be removed by one or more etch processes, such as dry etch process, wet etch process, or a combination thereof. The one or more etch processes selectively remove the sacrificial gate electrode layers 132 and the sacrificial gate dielectric layers 130 without substantially affects the ILD layer 162. The gate dielectric layer 168 may include one or more dielectric layers and may include the same material(s) as the sacrificial gate dielectric layer 130. In some embodiments, the gate dielectric layers may be deposited by one or more ALD processes or other suitable processes. The gate electrode layer 166 includes one or more layers of electrically conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layers may be formed by PVD, CVD, ALD, electro-plating, or other suitable method. The gate electrode layers 166 may be recessed to a level below the top surface of the ILD layer 162, and a self-aligned contact (SAC) layer 170 may be formed on each gate electrode layer.

As shown in FIG. 7A, portions of the ILD layer 162 and the CESL are removed to form openings 172. The openings 172 exposes the S/D epitaxial features 152/154. In some embodiments, the upper portion, such as the cap layer of the S/D epitaxial features 152/154 is removed. The forming of the openings 172 is described in detail in FIG. 8A.

Figure 7B:
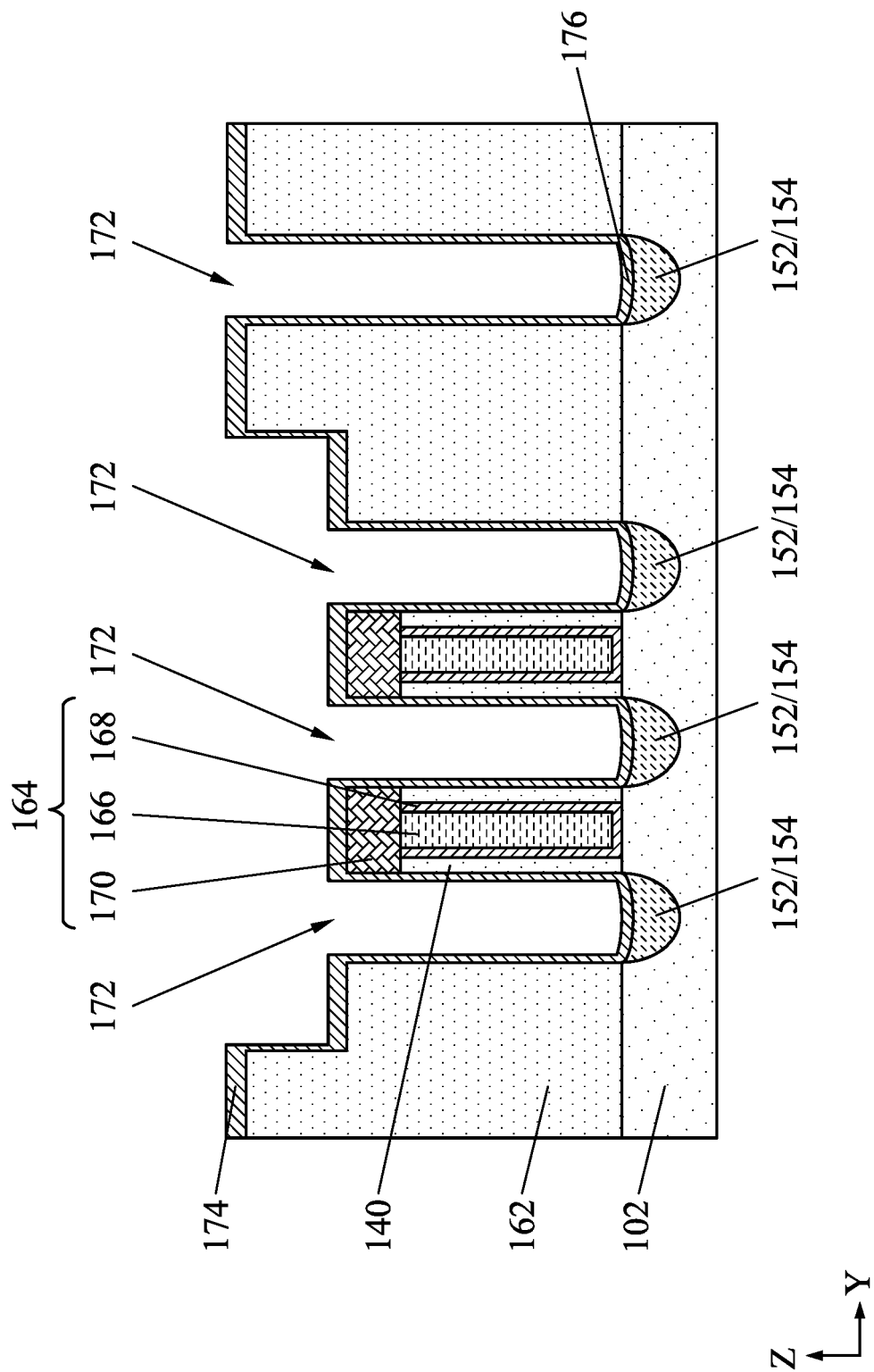

Next, as shown in FIG. 7B, a metal layer is formed in the openings 172 and on the ILD layer 162 and the SAC layers 170. The metal layer can be conformally deposited in the openings 172 (e.g., on sidewalls of the openings 172 and exposed surface of the S/D epitaxial features 152/154) and over the ILD layer 162. The metal layer may be or include titanium, tantalum, the like, or a combination thereof, and may be deposited by atomic layer deposition (ALD), chemical vapor deposition (CVD), physical vapor deposition (PVD), or another deposition technique.

As shown in FIG. 7B, a silicide region 176 may be formed on the S/D epitaxial feature 152/154 by reacting an upper portion of the S/D epitaxial feature 152 with the metal layer. An anneal may be performed to facilitate the reaction of the S/D epitaxial feature 152/154 with the metal layer to form the silicide region 176. In some embodiments, the silicide region 176 includes TiSi.

In some embodiments, the metal layer is treated to form a nitride layer 174. For example, a nitridation process, such as a nitrogen plasma process, can be performed on the metal layer to convert the metal layer into the nitride layer 174. In some examples, the metal layer can be completely converted such that no metal layer remains, while in other examples, a portion of the metal layer remains unconverted such that the portion of the metal layer remains with the nitride layer 174 on the metal layer. In some embodiments, silicon from the ILD layer 162 may diffuse into the nitride layer 174. As a result, the nitride layer 174 may include or be metal silicon nitride, such as TiSiN. In some embodiments, although not shown in FIG. 7B, the nitride layer 174 may be also formed on the silicide region 176.

Figure 7C:
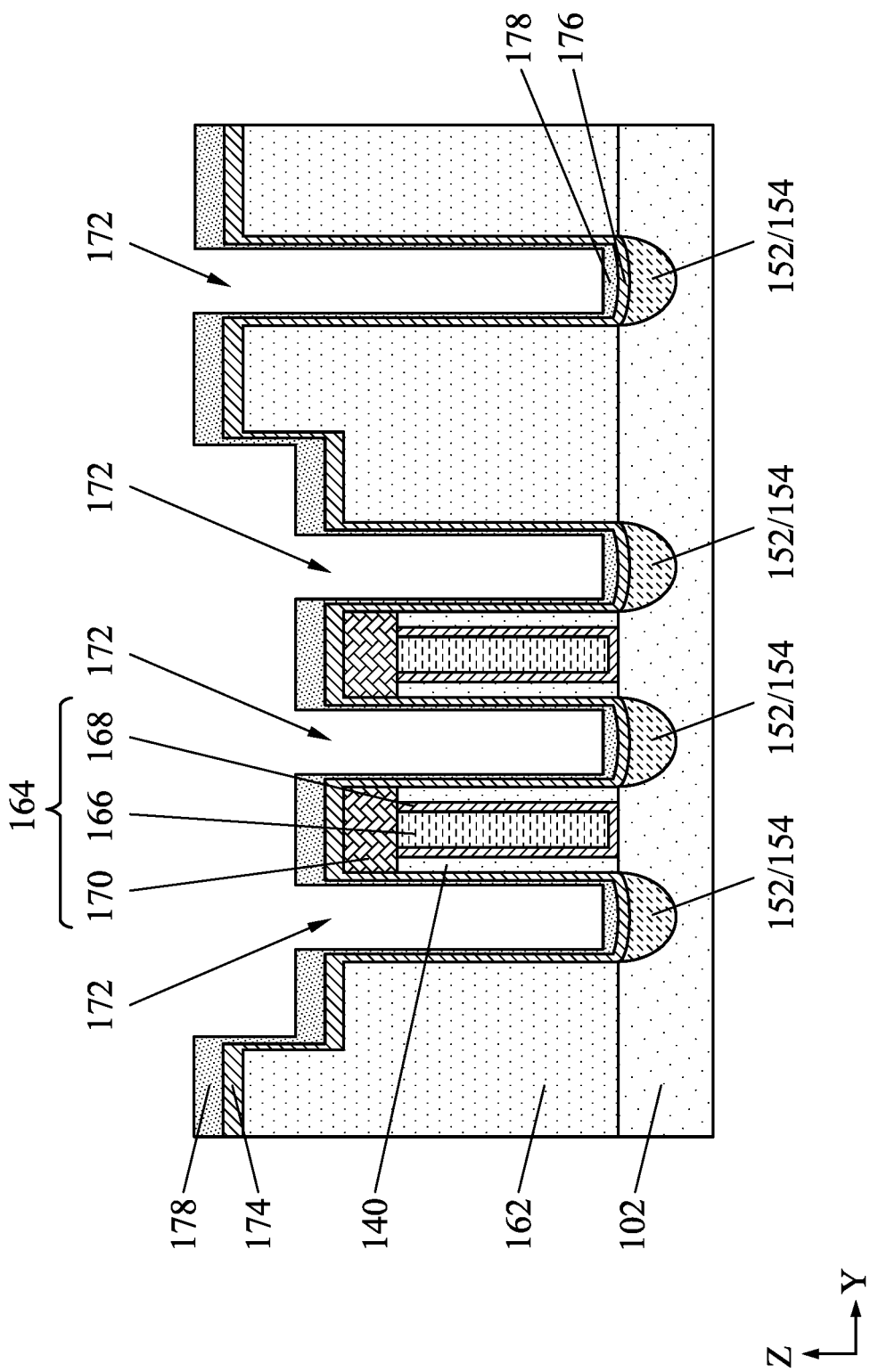

As shown in FIG. 7C, a metal layer 178 is formed on the nitride layer 174. The metal layer 178 may include tungsten (W), platinum (Pt), tantalum (Ta), titanium (Ti), copper (Cu), cobalt (Co), ruthenium (Ru), rhodium (Rh), iridium (Ir), molybdenum (Mo), or other suitable metal. In some embodiments, the metal layer 178 includes W. The metal layer 178 may be formed by PVD and may have different thicknesses in different regions. For example, the metal layer 178 may include top portions disposed over the ILD layer 162 and the SAC layers 170, sidewall portions disposed on the sidewall in the openings 172, and bottom portions disposed at the bottoms of the openings 172. The bottom portions connect the sidewall portion. The top portion has a first thickness in the z-axis, the sidewall portion has a second thickness in the x-axis and y-axis substantially less than the first thickness, and the bottom portion has a third thickness in the z-axis substantially less than the first thickness. In some embodiments, the third thickness is substantially greater than the second thickness. In some embodiments, the metal layer 178 functions as a seed layer for a subsequently formed bulk metal layer 182 (FIG. 7H).

Figure 7D:
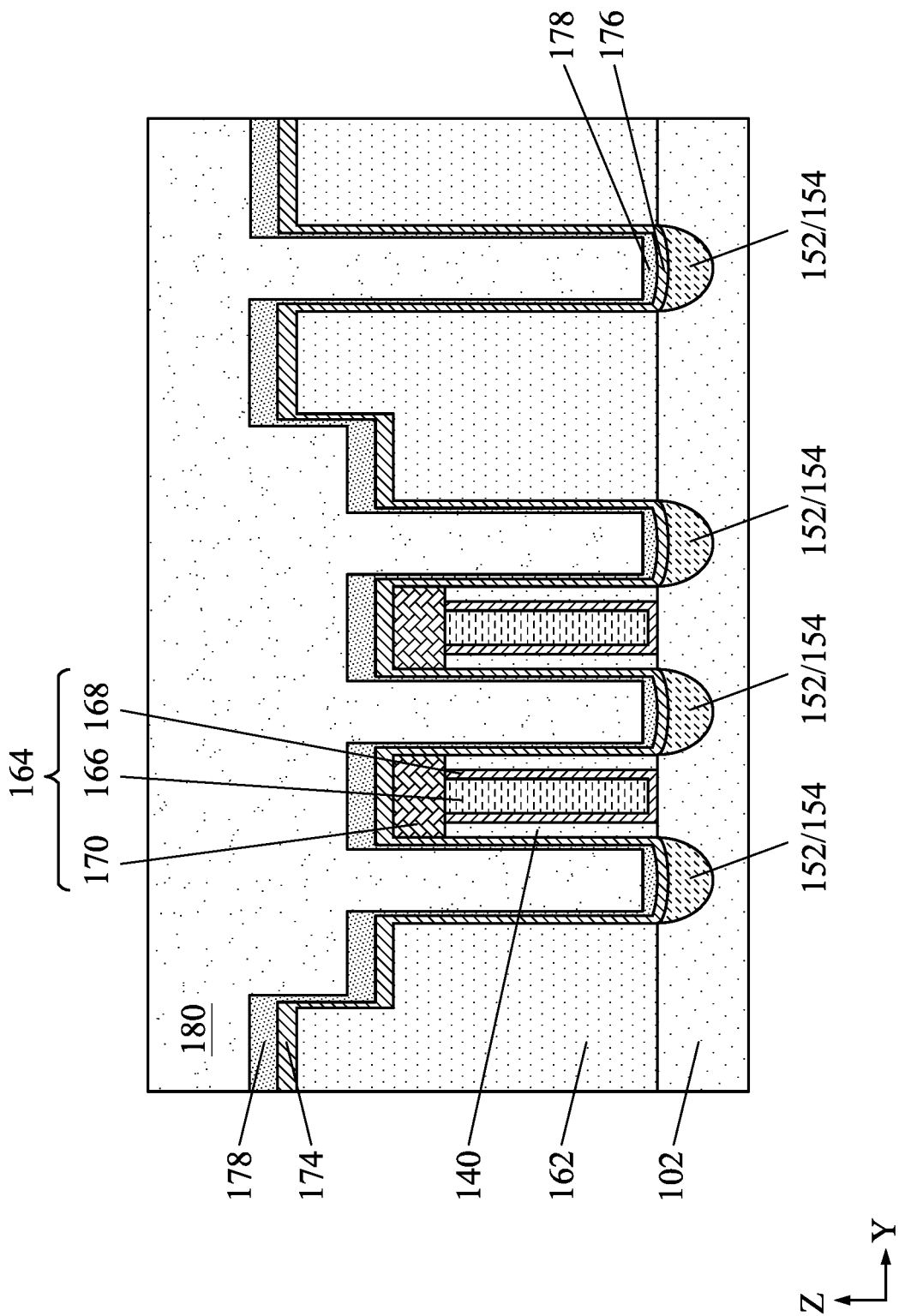

As shown in FIG. 7D, a sacrificial layer 180 is formed in the openings 172. The sacrificial layer 180 may be a bottom antireflective coating (BARC) layer. The sacrificial layer 180 may be also formed over the SAC layers 170 and the ILD layer 162.

Figure 7E:
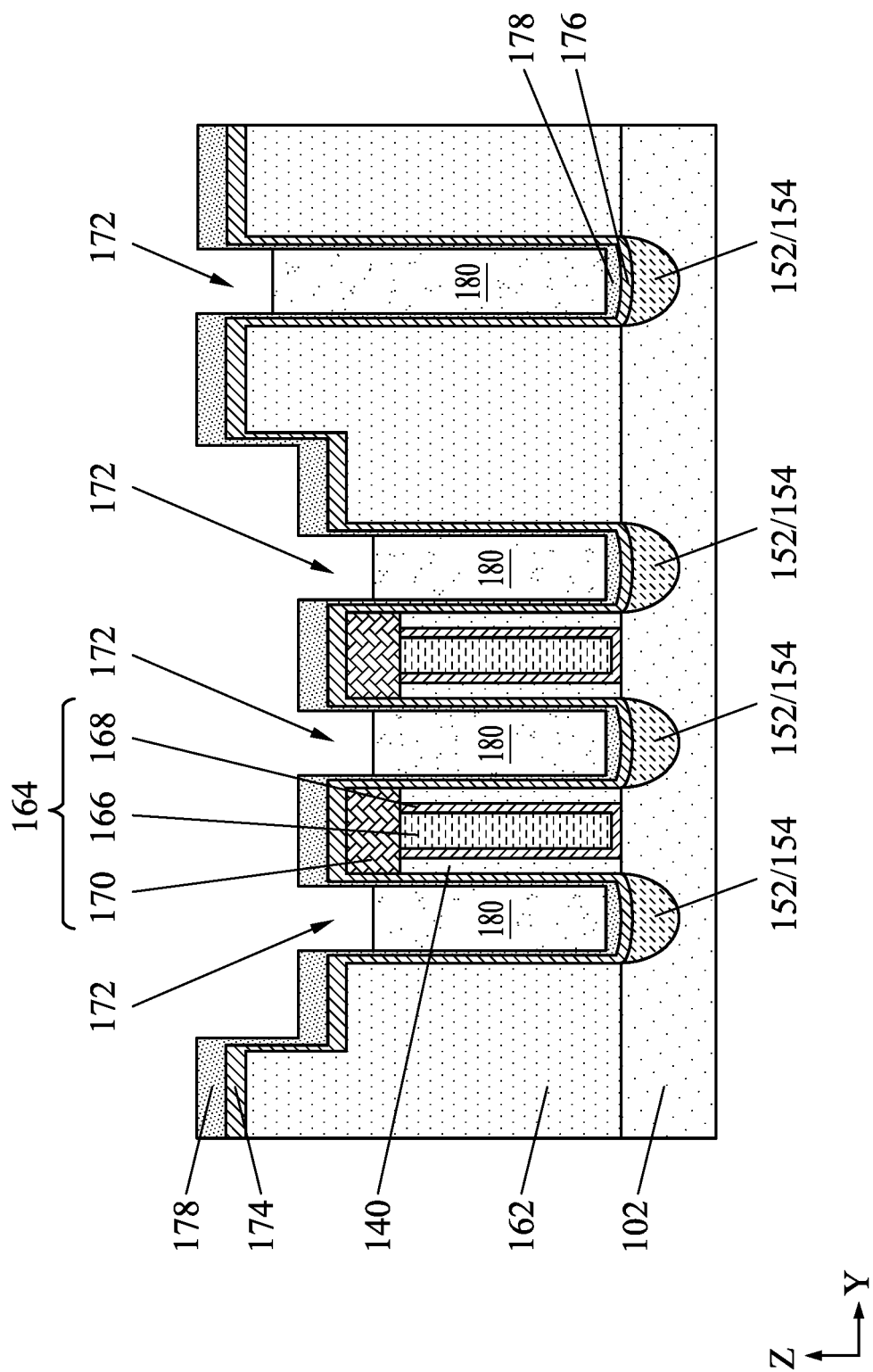

As shown in FIG. 7E, the sacrificial layer 180 is recessed to expose a portion of the openings 172. The sacrificial layer 180 may be recessed by a selective etch process that does not substantially affect the metal layer 178. The selective etch process may be a dry etch, a wet etch, or a combination thereof. In some embodiments, the selective etch process is a wet etch. The remaining sacrificial layer 180 is in contact with a portion of the sidewall portions of the metal layer 178, and a portion of the sidewall portion is exposed in the opening 172.

Figure 7F:
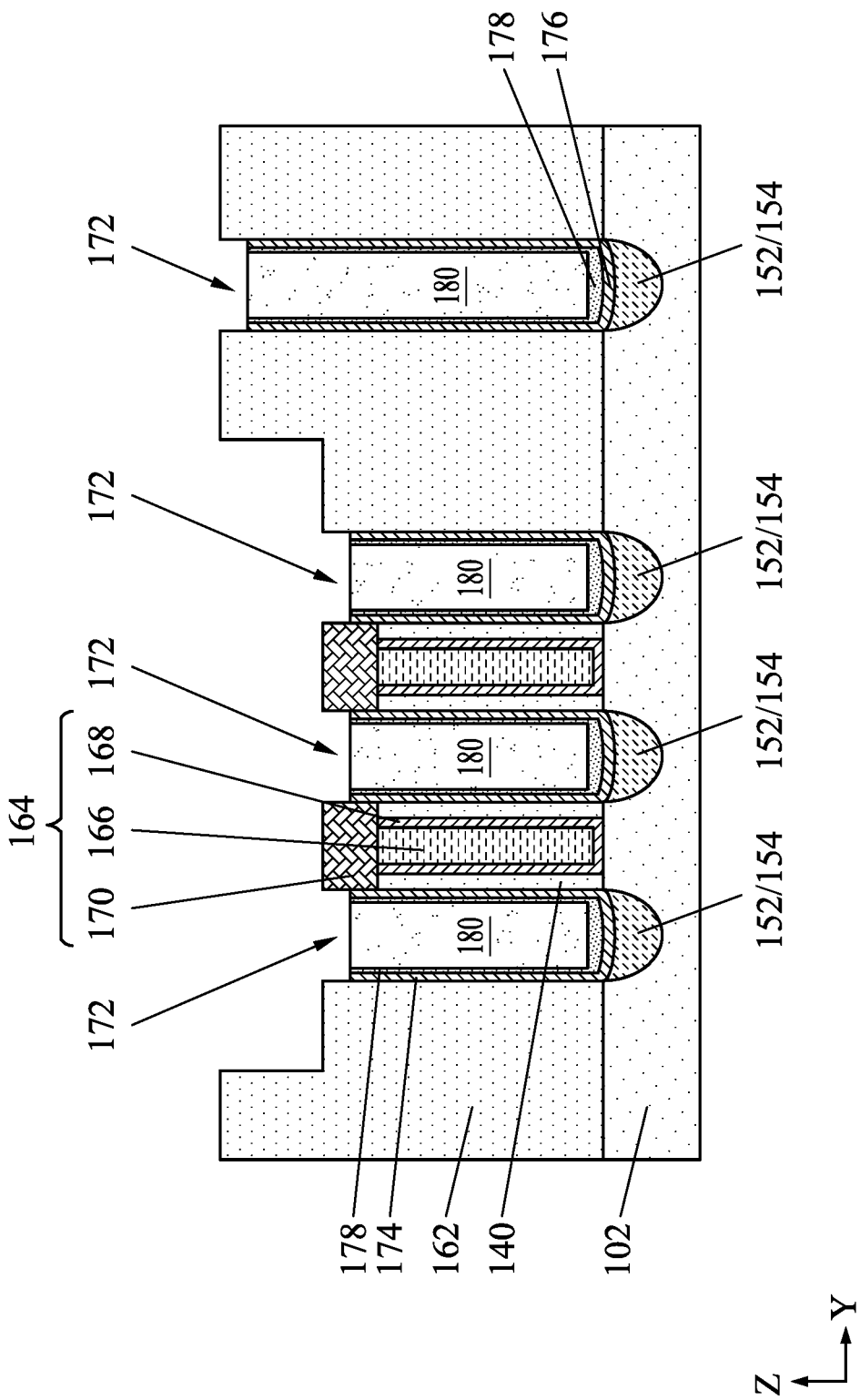

As shown in FIG. 7F, the exposed portion of the sidewall portions and the top portions of the metal layer 178 are removed. The exposed portion of the sidewall portions and the top portions of the metal layer 178 may be removed by a selective etch process, such as a dry etch, a wet etch, or a combination thereof. The removal of the exposed portion of the sidewall portions and the top portions exposes a portion of the nitride layer 174, and the exposed portion of the nitride layer 174 is removed. In some embodiments, the exposed portion of the nitride layer 174 is removed by the same process that removes the exposed portion of the sidewall portion and the top portion. Thus, the selective etch process removes portions of the metal layer 178 and the nitride layer 174 but does not substantially affect the SAC layers 170, the CESL, the ILD layer 162, and the sacrificial layer 180. In some embodiments, a different etch process is performed to remove the exposed portion of the nitride layer 174. The remaining sidewall portion and the nitride layer 174 may each include a top surface substantially coplanar with a top surface of the sacrificial layer 180.

Figure 7G:
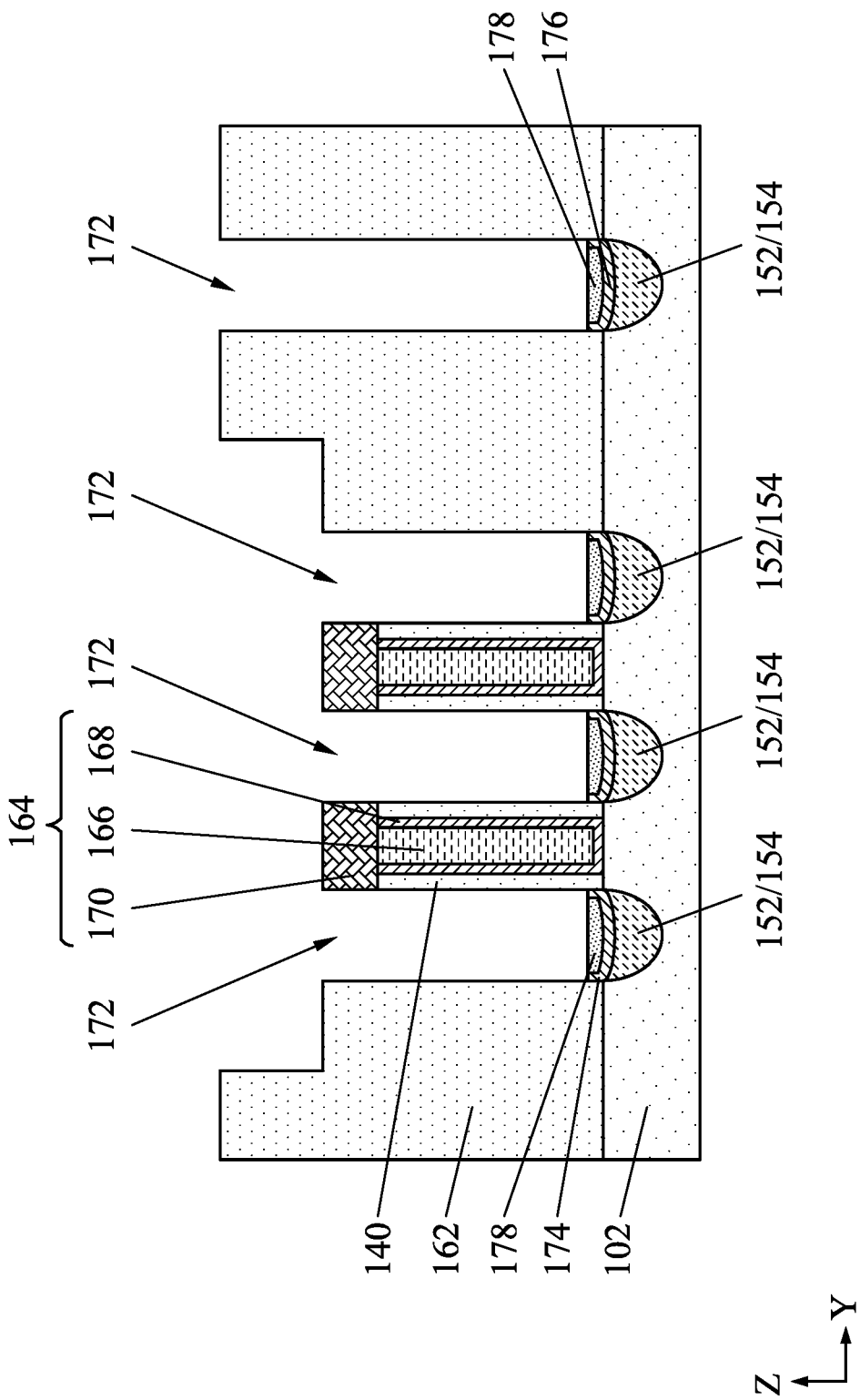
Figure 7H:
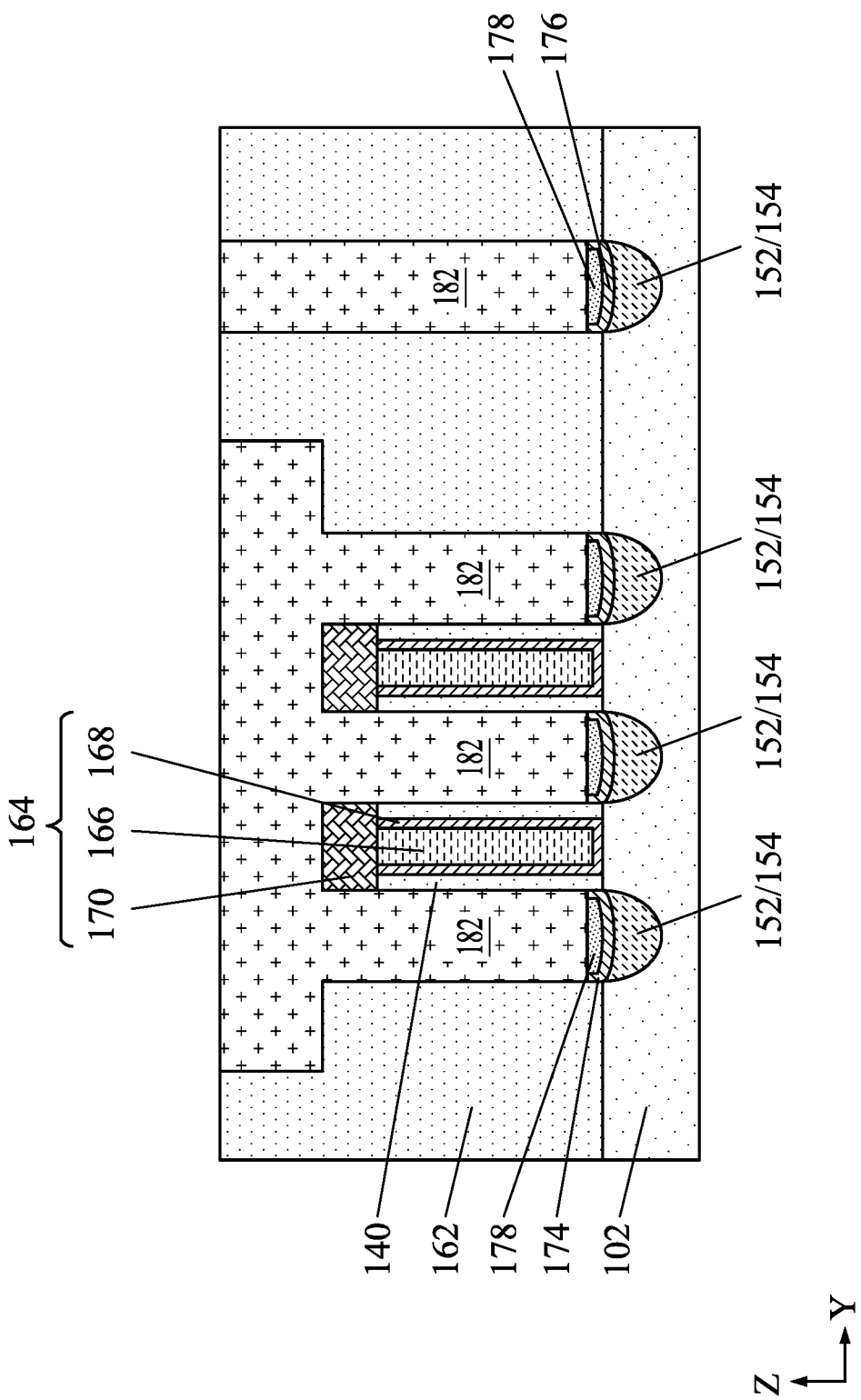

As shown in FIG. 7G, the sacrificial layer 180 is removed. The removal of the sacrificial layer 180 may be performed by the same process as the process for recessing the sacrificial layer 180 described in FIG. 7E. In some embodiments, the etch process to remove the sacrificial layer 180 is a dry etch, a wet etch, or a combination thereof. The etch process does not substantially affect the SAC layers 170, the CESL, the ILD layer 162, and the metal layer 178. As a result, the sidewall portions of the metal layer 178 are exposed in the openings 172.

As shown in FIG. 7G, the exposed sidewall portions of the metal layer 178 are removed. The sidewall portions may be removed by any suitable process, such as dry etch, wet etch, or a combination thereof. In some embodiments, a wet etch is performed to remove the sidewall portions. Because the thickness of the sidewall portion is substantially less than the thickness of the bottom portion of the metal layer 178, a portion of the bottom portion may be removed during the removal of the sidewall portion. As a result, a portion of the bottom portion of the metal layer 178 remains at the bottom of each opening 172. In some embodiments, the nitride layer 174 is also removed during the removal of the sidewall portion of the metal layer 178. In some embodiments, the nitride layer 174 remains in the openings 172.

As shown in FIG. 7H, a bulk metal layer 182 is formed on the bottom portion of the metal layer 178. In some embodiments, the bulk metal layer 182 may be formed in a bottom-up manner, and the bottom portion of the metal layer 178 functions as a seed layer for the bulk metal layer 182. The bulk metal layer 182 includes Ru, Mo, Co, Ni. W, Ti, Ta, Cu, Al, or other suitable conductive material. In some embodiments, the bulk metal layer 182 may include the same material as the metal layer 178. The bulk metal layer 182 may overfill the openings 172, and a planarization process, such as a CMP process, may be performed to expose the ILD layer 162 and the SAC layers 170. The bottom portion of the metal layer 178 and the bulk metal layer 182 together may form the conductive contact for the S/D epitaxial features 152, 154.

In some embodiments, an $H_2/O_2$ plasma treatment process is performed prior to forming the bulk metal layer 182, followed by a slow CVD of the bulk metal layer 182. In some embodiments, the bulk metal layer 182 includes a material different from the metal layer 178. In some embodiments, the metal layer 178 includes W, and the bulk metal layer 182 includes Mo.

FIGS. 8A and 8B are cross-sectional side views of various stages of manufacturing the semiconductor device structure 100, in accordance with some embodiments. FIG. 8A illustrates the stage of manufacturing the semiconductor device structure 100 shown in FIG. 7A. As shown in FIG. 8A, an S/D epitaxial feature 152 disposed in the NMOS region 102N is adjacent to an S/D epitaxial feature 154 disposed in the PMOS region 102P, and the dielectric feature 114c is disposed between the S/D epitaxial features 152, 154. In some embodiments, the S/D epitaxial feature 152 is disposed between the dielectric feature 114c and a dielectric feature 114f, and the S/D epitaxial feature 154 is disposed between the dielectric feature 114c and a dielectric feature 114g. Each dielectric feature 114f, 114g includes the liner 116 and the low-K dielectric material 118.

As shown in FIG. 8A, the openings 172 are formed in the ILD layer 162 and the CESL (not shown). As described before, portions of the S/D epitaxial features 152, 154 may be also removed during the formation of the openings 172. In order to minimize the risk of shorting between the conductive contacts in the NMOS region 102N and the PMOS region 102P, the openings 172 are formed spaced apart by a distance D1. In some embodiments, the distance D1 is substantially greater than the width W1 of the dielectric feature 114c. For example, the distance D1 may be about 1.5 times to about 2 times the width W1. If the distance D1 is less than about 1.5 times the width W1, the risk of shorting between the conductive contacts in the NMOS region 102N and the PMOS region 102P may be increased. On the other hand, if the distance D1 is greater than about 2 times the width W1, the dimensions of the conductive contact may be too small, which leads to increased electrical resistance. In some embodiments, due to the large distance D1, a portion of the S/D epitaxial feature 152 and a portion of the S/D epitaxial feature 154 are covered by the ILD layer 162 and not exposed in the openings 172, as shown in FIG. 8A.

In some embodiments, in order to increase the dimensions of the conductive contact and the contact area on the S/D epitaxial features 152, 154, the openings 172 extend into the dielectric features 114f, 114g. For example, as shown in FIG. 8A, a portion of the liner 116 of the dielectric feature 114f is removed. Similarly, a portion of the liner 116 of the dielectric feature 114g is removed. In some embodiments, the low-K dielectric material 118 is exposed in the opening 172. In some embodiments, a portion of the liner 116 is exposed in the opening 172. The thickness of the liner 116 ranges from about 3 nm to about 10 nm, and each opening 172 extends into the dielectric feature 114f, 114g along the x-axis by about 3 nm to about 10 nm. If the opening 172 extends into the dielectric feature 114f, 114g by more than 10 nm, the risk of shorting between the conductive contact formed over the S/D epitaxial feature 152, 154 and the conductive contact formed on the other side of the dielectric feature 114f, 114g is increased. On the other hand, if the opening 172 extends into the dielectric feature 114f, 114g by less than about 3 nm, the dimensions of the conductive contact and the contact area may be too small, leading to increased electrical resistance.

In some embodiments, in order to further decrease electrical resistance between the conductive contact and the corresponding S/D epitaxial feature 152, 154, the exposed portion of the cap layer of the S/D epitaxial feature 152, 154 in the opening 172 is removed. As described before, the dopant concentration of the cap layer of the S/D epitaxial feature 152, 154 may be substantially less than the dopant concentration of the main layer of the S/D epitaxial feature 152, 154, and the higher dopant concentration leads to decreased electrical resistance. Thus, in some embodiments, each S/D epitaxial feature 152, 154 includes a portion of the cap layer covered by the ILD layer 162, and the exposed portion of each S/D epitaxial feature 152, 154 is the main layer.

In some embodiments, each opening 172 is formed by multiple etch processes. For example, a first etch process is performed to remove a portion of the ILD layer 162 to expose a portion of the CESL and a portion of the liner 116, a second etch process is performed to remove the exposed portion of the CESL and the exposed portion of the liner 116 to expose a portion of the S/D epitaxial feature 152, 154, and a third etch process is performed to remove a portion, such as a portion of the cap layer, of the S/D epitaxial feature 152, 154. Each etch process may be a selective etch process that does not substantially remove other materials of the semiconductor device structure 100. Separate selective etch processes to remove the materials lead to improved controlling of the dimensions of the resulting features. In some embodiments, the etch processes are controlled so the opening 172 does not extend to the side surface of the lower 50 percent of the S/D epitaxial feature 152, 154. In other words, the opening 172 does not expose a vertical surface of the S/D epitaxial feature 152, 154. As described in FIG. 7C, the metal layer 178 is formed by a PVD process, which does not form a substantial metal layer 178 on vertical surfaces. Thus, by controlling the depth of the opening 172, void or seam can be avoided in the bulk metal layer 182 (FIG. 7H). In some embodiments, the material of the S/D epitaxial feature 154 is etched at a faster rate than the material of the S/D epitaxial feature 152. As a result, the opening 172 formed over the S/D epitaxial feature 152 is shallower than the opening 172 formed over the S/D epitaxial feature 154. In some embodiments, the opening 172 formed over the S/D epitaxial feature 154 is deeper by about 10 nm to about 15 nm than the opening 172 formed over the S/D epitaxial feature 152.

As shown in FIG. 8B, the silicide regions 176, the metal layers 178, and the bulk metal layers 182 are formed in the openings 172. The silicide regions 176, the metal layers 178, and the bulk metal layers 182 may be formed by the processes described in FIGS. 7B to 7H. Each metal layer 178 may include a top portion 178$t$ and a side portion 178$s$. In some embodiments, the thickness of the top portion 178$t$ is substantially greater than the thickness of the side portion 178$s$ as a result of the PVD. For example, the thickness of the top portion 178$t$ ranges from about 5 nm to about 10 nm, and the thickness of the side portion 178$s$ ranges from about 3 nm to about 5 nm.

In some embodiments, as shown in FIG. 8B, an angle θ1 is formed between the side portion 178$s$ formed over the S/D epitaxial feature 152 and a plane P defined by the back surface of the substrate 102, and an angle θ2 is formed between the side portion 178$s$ formed over the S/D epitaxial feature 154 and the plane P. In some embodiments, the angle θ1 is substantially greater than the angle θ2. For example, the angle θ1 may range from about 50 degrees to about 70 degrees, and the angle θ2 may range from about 30 degrees to about 60 degrees. The angles θ1 and θ2 are the result of the openings 172 not extending to expose vertical surfaces of the S/D epitaxial features 152, 154. The acute angles θ1 and θ2 ensure that the metal layers 178, such as the side portions 178$s$ of the metal layer 178, are formed over the S/D epitaxial features 152, 154 and that the side portions 178$s$ having sufficient thickness. As a result, electrical resistance is reduced. By extending the openings 172 into the dielectric features 114$f$, 114$g$, the metal layer 178 and the bulk metal layer 182 are extended into the dielectric features 114$f$, 114$g$, and the contact areas between the metal layers 178 and the corresponding silicide regions 176 are maximized, which further reduces electrical resistance.

As described above, the bulk metal layer 182 and the metal layer 178 formed in each opening 172 is a conductive contact. With the distance D1 (FIG. 8A) between the conductive contacts for the PMOS region 102P and the NMOS region 102N, the risk of shorting is reduced.

The present disclosure provides a semiconductor device structure 100 including conductive contacts for PMOS region 102P and NMOS region 102N separated by a distance D1. Each conductive contact extends to a portion of a dielectric feature 114$f$, 114$g$ disposed adjacent the corresponding S/D epitaxial feature 152, 154, which increases contact area. Some embodiments may achieve advantages. For example, the increased contact area reduces contact resistance, and the distance D1 between the conductive contacts reduces the risk of shorting.

An embodiment is a method. The method includes forming a first semiconductor fin in an NMOS region and a second semiconductor fin in a PMOS region, forming a dielectric feature between the first and second semiconductor fins, recessing the first and second semiconductor fins, forming a first source/drain epitaxial feature over the recessed first semiconductor fin and a second source/drain epitaxial feature over the recessed second semiconductor fin, depositing an interlayer dielectric layer over the first and second source/drain epitaxial features, and forming a first opening in the interlayer dielectric layer to expose a first portion of the first source/drain epitaxial feature and a second opening in the interlayer dielectric layer to expose a first portion of the second source/drain epitaxial feature. The first and second openings are separated by a distance, and the distance is about 1.5 times to about 2 times a width of the dielectric feature.

Another embodiment is a method. The method includes forming a first semiconductor fin in an NMOS region and a second semiconductor fin in a PMOS region and forming first, second, and third dielectric features. The first semiconductor fin is disposed between the first and second dielectric features, and the second semiconductor fin is disposed between the second and third dielectric features. The method further includes recessing the first and second semiconductor fins, forming a first source/drain epitaxial feature over the recessed first semiconductor fin and a second source/drain epitaxial feature over the recessed second semiconductor fin, depositing an interlayer dielectric layer over the first and second source/drain epitaxial features, and forming a first opening in the interlayer dielectric layer and a second opening in the interlayer dielectric layer. The first opening extends into the first dielectric feature by about 3 nm to about 10 nm.

A further embodiment is a semiconductor device structure. The structure includes a first source/drain epitaxial feature disposed in an NMOS region over a substrate, a second source/drain epitaxial feature disposed in a PMOS region, a first dielectric feature disposed between the first source/drain epitaxial feature and the second source/drain epitaxial feature, and a second dielectric feature disposed adjacent the first source/drain epitaxial feature. The first source/drain epitaxial feature is disposed between the first and second dielectric features. The structure further includes a third dielectric feature disposed adjacent the second source/drain epitaxial feature, and the second source/drain epitaxial feature is disposed between the first and third dielectric features. The structure further includes an interlayer dielectric layer disposed over the first, second, and third dielectric features, over a first portion of the first source/drain epitaxial feature, and over a first portion of the second source/drain epitaxial feature, a first metal layer disposed in the interlayer dielectric layer and over a second portion of the first source/drain epitaxial feature, and the first metal layer extends into the second dielectric feature. The structure further includes a second metal layer disposed in the interlayer dielectric layer and over a second portion of the second source/drain epitaxial feature, and the second metal layer extends into the third dielectric feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:
    forming a first semiconductor fin in an NMOS region and a second semiconductor fin in a PMOS region;
    forming a dielectric feature between the first and second semiconductor fins, wherein the dielectric feature has a width;
    recessing the first and second semiconductor fins;
    forming a first source/drain epitaxial feature over the recessed first semiconductor fin and a second source/drain epitaxial feature over the recessed second semiconductor fin;
    depositing an interlayer dielectric layer over the first and second source/drain epitaxial features; and
    forming a first opening in the interlayer dielectric layer to expose a first portion of the first source/drain epitaxial feature and a second opening in the interlayer dielectric layer to expose a first portion of the second source/drain epitaxial feature, wherein the first and second openings are separated by a distance, and the distance is about 1.5 times to about 2 times the width of the dielectric feature,
    wherein the first opening is formed by removing a first portion of the interlayer dielectric layer and a second portion of the first source/drain epitaxial feature, and the second opening is formed by removing a second portion of the interlayer dielectric layer and a second portion of the second source/drain epitaxial feature,
    wherein a third portion of the interlayer dielectric layer is disposed over a third portion of the first source/drain epitaxial feature and a third portion of the second source/drain epitaxial feature after the forming of the first and second openings.

2. The method of claim 1, wherein the first opening is shallower than the second opening.

3. The method of claim 1, further comprising forming a first silicide region on the first portion of the first source/drain epitaxial feature and a second silicide region on the first portion of the second source/drain epitaxial feature.

4. The method of claim 3, further comprising depositing a metal layer on the first and second silicide regions.

5. The method of claim 4, wherein the metal layer is deposited by a physical vapor deposition process.

6. The method of claim 4, further comprising depositing a bulk metal layer on the metal layer.

7. A method for forming a semiconductor device structure, comprising:
    forming a first semiconductor fin in an NMOS region and a second semiconductor fin in a PMOS region;
    forming first, second, and third dielectric features, wherein the first semiconductor fin is disposed between the first and second dielectric features, and the second semiconductor fin is disposed between the second and third dielectric features;
    recessing the first and second semiconductor fins;
    forming a first source/drain epitaxial feature over the recessed first semiconductor fin and a second source/drain epitaxial feature over the recessed second semiconductor fin;
    depositing an interlayer dielectric layer over the first and second source/drain epitaxial features; and
    forming a first opening in the interlayer dielectric layer and a second opening in the interlayer dielectric layer, wherein the first opening extends into the first dielectric feature by about 3 nm to about 10 nm.

8. The method of claim 7, wherein the first, second, and third dielectric features each comprises a liner and a low-K dielectric material.

9. The method of claim 8, wherein a portion of the liner of the first dielectric feature is removed during the forming of the first opening.

10. The method of claim 8, wherein the second opening extends to the third dielectric feature by about 3 nm to about 10 nm.

11. The method of claim 10, wherein a portion of the liner of the third dielectric feature is removed during the forming of the second opening.

12. A semiconductor device structure, comprising:
    a first source/drain epitaxial feature disposed in an NMOS region over a substrate;
    a second source/drain epitaxial feature disposed in a PMOS region;
    a first dielectric feature disposed between the first source/drain epitaxial feature and the second source/drain epitaxial feature, wherein the first dielectric feature comprises a first liner and a first low-K dielectric material;
    a second dielectric feature disposed adjacent the first source/drain epitaxial feature, wherein the first source/drain epitaxial feature is disposed between the first and second dielectric features, and the second dielectric feature comprises a second liner and a second low-K dielectric material;
    a third dielectric feature disposed adjacent the second source/drain epitaxial feature, wherein the second source/drain epitaxial feature is disposed between the first and third dielectric features, and the third dielectric feature comprises a third liner and a third low-K dielectric material;
    an interlayer dielectric layer disposed over the first, second, and third dielectric features, over a first portion of the first source/drain epitaxial feature, and over a first portion of the second source/drain epitaxial feature;
    a first metal layer disposed in the interlayer dielectric layer and over a second portion of the first source/drain epitaxial feature, wherein the first metal layer is disposed over a top surface of the second liner; and
    a second metal layer disposed in the interlayer dielectric layer and over a second portion of the second source/drain epitaxial feature, wherein the second metal layer extends into the third dielectric feature.

13. The semiconductor device structure of claim 12, further comprising a first silicide region disposed on the second portion of the first source/drain epitaxial feature, wherein the first metal layer is disposed on the first silicide region.

14. The semiconductor device structure of claim 13, further comprising a second silicide region disposed on the second portion of the second source/drain epitaxial feature, wherein the second metal layer is disposed on the second silicide region.

15. The semiconductor device structure of claim 14, further comprising a bulk metal layer disposed on the first metal layer.

16. The semiconductor device structure of claim 15, wherein the bulk metal layer and the first metal layer comprise different materials.

17. The semiconductor device structure of claim 15, wherein the bulk metal layer is disposed over the top surface of the second liner.

18. The semiconductor device structure of claim 12, wherein a side portion of the first metal layer forms a first acute angle with respect to a plane defined by a back surface of the substrate, and a side portion of the second metal layer forms a second acute angle with respect to the plane.

19. The semiconductor device structure of claim 18, wherein the first acute angle is substantially larger than the second acute angle.

20. The semiconductor device structure of claim 12, wherein the second metal layer is disposed over a top surface of the third liner.

* * * * *